United States Patent
Nagase et al.

(10) Patent No.: US 10,381,435 B2
(45) Date of Patent: Aug. 13, 2019

(54) SEMICONDUCTOR DEVICE AND MANUFACTURING METHOD THEREFOR

(71) Applicant: Renesas Electronics Corporation, Tokyo (JP)

(72) Inventors: Senichirou Nagase, Hitachinaka (JP); Tsuyoshi Kachi, Hitachinaka (JP); Yoshinori Hoshino, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/950,977

(22) Filed: Apr. 11, 2018

(65) Prior Publication Data

US 2018/0358434 A1    Dec. 13, 2018

(30) Foreign Application Priority Data

Jun. 8, 2017    (JP) .................................. 2017-113269

(51) Int. Cl.
*H01L 29/06*    (2006.01)
*H01L 29/78*    (2006.01)

(52) U.S. Cl.
CPC ...... *H01L 29/0634* (2013.01); *H01L 29/0653* (2013.01); *H01L 29/0692* (2013.01); *H01L 29/7802* (2013.01)

(58) Field of Classification Search
None
See application file for complete search history.

(56) References Cited

U.S. PATENT DOCUMENTS

| | | | |
|---|---|---|---|
| 6,410,958 B1 | 6/2002 | Usui et al. | |
| 6,740,931 B2 | 5/2004 | Kouzuki et al. | |
| 7,790,549 B2 * | 9/2010 | Hebert | H01L 29/0634 438/268 |
| 9,209,249 B2 | 12/2015 | Kachi | |
| 9,293,527 B1 * | 3/2016 | Hsieh | H01L 29/0634 |

FOREIGN PATENT DOCUMENTS

| | | |
|---|---|---|
| JP | 2002-164540 A | 6/2002 |
| JP | 2003-309261 A | 10/2003 |
| JP | 2005-228806 A | 8/2005 |
| JP | 2005-303253 A | 10/2005 |
| JP | 2014-154596 A | 8/2014 |

* cited by examiner

*Primary Examiner* — Chandra Chaudhari
(74) *Attorney, Agent, or Firm* — McGinn IP Law Group, PLLC

(57) ABSTRACT

A deep trench which reaches a predetermined depth from one principal surface is formed in an element region of a semiconductor substrate. A TEOS oxide film and a polycrystalline silicon film are formed so as to fill the deep trench. In formation of a MOSFET and in formation of a protective insulating film on/over a surface of an element region by thermal oxidation, a silicon thermal oxide film grows, the TEOS oxide film contracts and the polycrystalline silicon film expands when oxidized and turning into a silicon oxide film, and thereby an embedded insulator is formed in the deep trench.

14 Claims, 40 Drawing Sheets

SEMICONDUCTOR DEVICE AND MANUFACTURING METHOD THEREFOR

CROSS-REFERENCE TO RELATED APPLICATIONS

The disclosure of Japanese Patent Application No. 2017-113269 filed on Jun. 8, 2017 including the specification, drawings and abstract is incorporated herein by reference in its entirety.

BACKGROUND

The present invention relates to a semiconductor device and a manufacturing method for the semiconductor device and is preferably utilizable to a semiconductor device having, for example, a super-junction structure.

The super-junction structure is used in a power semiconductor device as a structure that p-n junctions are periodically arranged thereby to obtain a low conduction resistance and a high junction withstand voltage. As patent documents which disclose such semiconductor devices, there are, for example, Japanese Unexamined Patent Application Publication No. 2002-164540, Japanese Unexamined Patent Application Publication No. 2003-309261, Japanese Unexamined Patent Application Publication No. 2005-228806, Japanese Unexamined Patent Application Publication No. 2005-303253 and Japanese Unexamined Patent Application Publication No. 2014-154596.

In the semiconductor device of the above-mentioned type, a comparatively deep trench is formed in an element formation region in which a semiconductor element is arranged and an insulating film and so forth are formed in the trench by, for example, a CVD (Chemical Vaper Deposition) method. An aspect ratio of the deep trench (a depth of the trench/a width of the trench) is set to at least about 7.

SUMMARY

In a case where, for example, a MOSFET (Metal Oxide Semiconductor Field Effect Transistor) is formed as a semiconductor element in a manufacturing process for the semiconductor device, a protective insulating film is formed by performing thermal oxidation treatment after formation of the insulating film and so forth in the deep trench in order to reduce damage caused by ion implantation. The insulating film and so forth which are formed in the deep trench are prone to contract in association with performance of the thermal oxidation treatment. A semiconductor substrate becomes liable to warp into a downward-convex shape due to contraction of the insulating film and so forth.

In particular, in the super-junction structure, a rate of an occupation area that a region in which the deep trenches are formed occupies in an element region is comparatively high (for example, about 30%). Therefore, the semiconductor substrate becomes very liable to warp by contraction of the insulating film and so forth formed in each deep trench. In a case where the semiconductor substrate warps, there are cases where a conveyance error occurs in a semiconductor manufacturing device. In addition, there are cases where the semiconductor substrate is not surely sucked onto a stage. Further, warpage of the semiconductor substrate becomes one of causes of leakage current.

Other issues and novel features of the present invention will become apparent from the description of the present specification and the appended drawings.

According to one embodiment of the present disclosure, there is provided a manufacturing method for a semiconductor device which includes a semiconductor element in which a first conductivity type first region and a second conductivity type second region which is formed in contact with the first conductivity type first region are alternately arranged and which performs electric current conduction between a first principal surface and a second principal surface of a semiconductor substrate. The manufacturing method includes the following steps of forming the semiconductor element, defining an element region on the first principal surface side of the semiconductor substrate, forming a trench which reaches a first depth from the first principal surface of the semiconductor substrate in the element region, introducing a first conductivity type first impurity through the trench and thereby forming the first conductivity type first region down to a second depth which is deeper than the first depth from the first principal surface of the semiconductor substrate, introducing a second conductivity type second impurity through the trench and thereby forming the second conductivity type second region in contact with the first conductivity type first region along sidewall faces of the trench, and forming an embedding element which includes a first film and a second film to fill the trench with the embedding element. The step of forming the semiconductor element includes the step of forming a protective insulating film on/over the first principal surface of the semiconductor substrate which is located in the element region by thermal oxidation. In the step of forming the protective insulating film, the first film contracts, the second film expands and the embedding element turns into an embedded insulator by the thermal oxidation. After the step of forming the protective insulating film, a state where the first film contracts is maintained and a state where the second film expands is maintained.

According to another embodiment of the present invention, there is provided a semiconductor device which includes a semiconductor element in which a first conductivity type first region and a second conductivity type second region which is formed in contact with the first conductivity type first region are alternately arranged and which performs electric current conduction between a first principal surface and a second principal surface of a semiconductor substrate and includes an element region and an embedded insulator. The element region is defined on the first principal surface side of the semiconductor substrate and the first conductivity type first region and the second conductivity type second region are arranged in the element region. The embedded insulator is formed in the element region and is formed down to a first depth from the first principal surface of the semiconductor substrate in contact with the second conductivity type second region. The embedded insulator includes an oxidation block film and an oxide film. The oxidation block film is formed in contact with the second conductivity type second region and blocks oxidation. The oxide film is formed in contact with the oxidation block film.

According to the manufacturing method for semiconductor device pertaining to one embodiment, it is possible to suppress the warping of the semiconductor substrate.

According to the semiconductor device pertaining to another embodiment, it is possible to suppress the warpage of the semiconductor substrate.

DETAILED DESCRIPTION

First Embodiment

Figure 1:
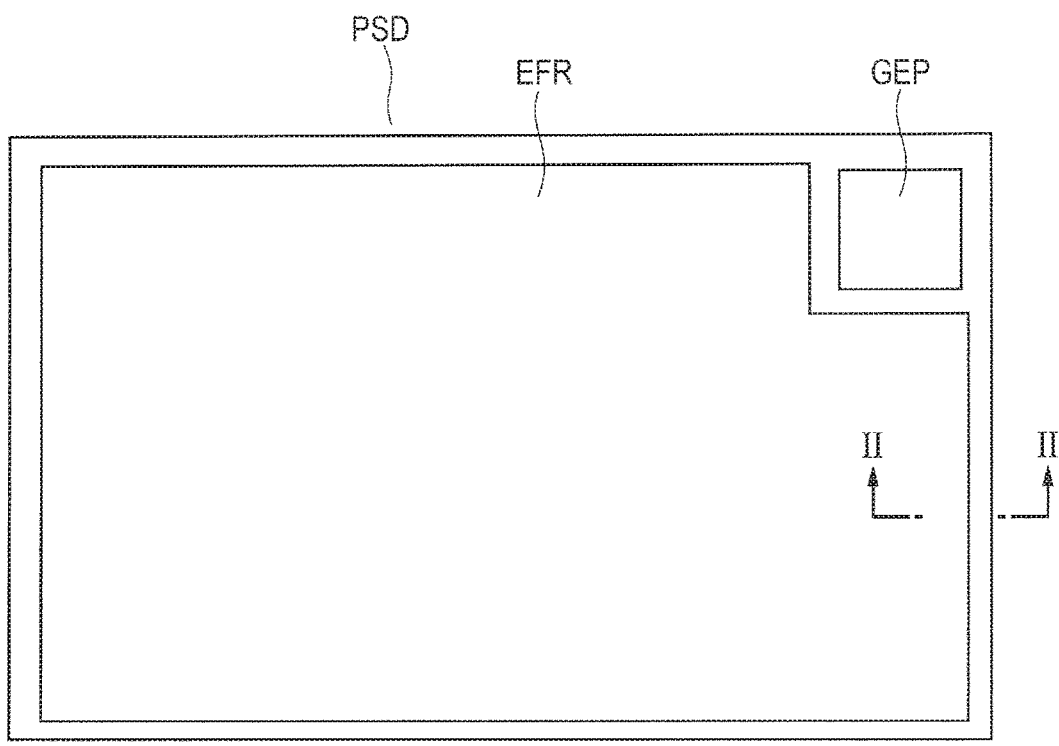
FIG. 1 is a plan view illustrating one example of a planar pattern of a semiconductor device according to a first embodiment.
Figure 2:
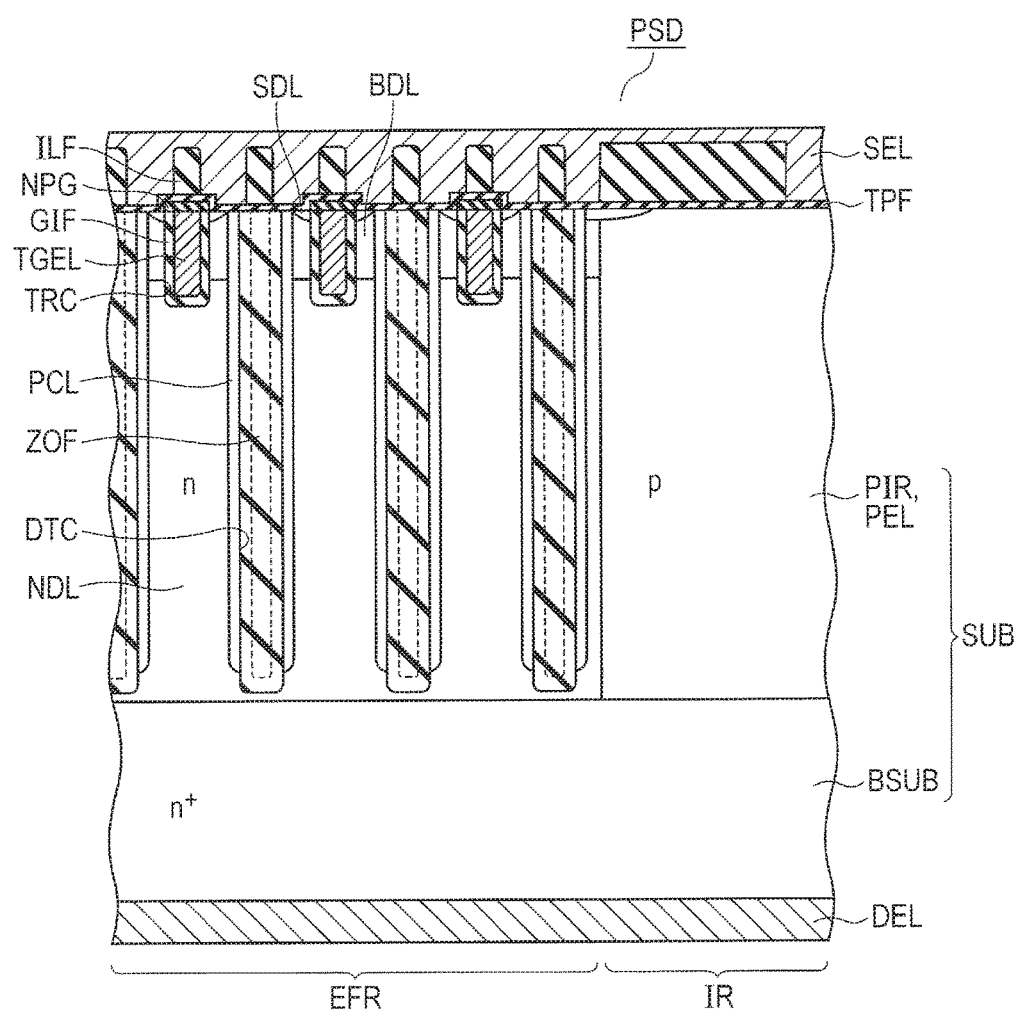
FIG. 2 is a sectional diagram of the semiconductor device according to the first embodiment along the profile line II-II illustrated in FIG. 1.

A semiconductor device PSD according to the first embodiment will be described. In the semiconductor device PSD, an element region EFR and a gate electrode pad GEP are defined on the side of a first principal surface of a semiconductor substrate SUB as illustrated in FIG. 1 and FIG. 2. The element region EFR is electrically isolated from other regions (not illustrated) by an isolation region IR. The semiconductor substrate SUB includes an n$^+$-type substrate BSUB and a p-type epitaxial layer PEL which is formed on/over a front surface of the n$^+$-type substrate BSUB. Part of the n-type epitaxial layer PEL serves as a p-type isolation layer PIR of the isolation region IR.

An n-type drift layer NDL (a first region) is formed down to a predetermined depth (a second depth) from one principal surface (the first principal surface) of the semiconductor substrate SUB in the element region EFR. Each deep trench DTC which reaches a predetermined depth (a first depth) from the one principal surface (the first principal surface) of the semiconductor substrate SUB in the n-type drift layer NDL. An embedded insulator ZOF is formed in the deep trench DTC. The embedded insulator ZOF is formed by performing thermal oxidation treatment in a state where a silicon oxide film and a polycrystalline silicon film (both are not illustrated) are formed in the deep trench DTC as will be described later.

A p-type column layer PCL (a second region) is formed in contact with the embedded insulator ZOF. The p-type column layer PCL is also in contact with the n-type drift layer NDL. The p-type column layer PCL and the n-type drift layer NDL are alternately arranged as a super-junction structure.

For example, a MOSFET is formed as a semiconductor element in the element region EFR. Each gate trench TRC which reaches a predetermined depth (a third depth) from the one principal surface (the first principal surface) of the semiconductor substrate SUB is formed in the n-type drift layer NDL. The depth of the gate trench TRC is shallower than the depth of the deep trench DTC. A gate electrode TGEL is formed in the gate trench TRC with a gate insulating film GIF being interposed between the gate electrode TGEL and the gate trench TRC. The gate electrode TGEL is electrically coupled to the gate electrode pad GEP.

In addition, a p-type base diffusion layer BDL is formed across a zone of a depth which is shallower than the depth of the gate trench TRC from the one principal surface (the first principal surface) of the semiconductor substrate SUB in the n-type drift layer NDL. The gate insulating film GIF and the gate electrode TGEL are formed through the base diffusion layer BDL to reach the n-type drift layer NDL. A silicon nitride film NPG is formed to cover the gate electrode TGEL. An n-type source diffusion layer SDL is formed in the base diffusion layer BDL.

A protective insulating film TPF is formed to cover the first principal surface of the semiconductor substrate SUB. Each interlayer insulating film ILF is formed on/over the protective insulating film TPF to cover, for example, each gate electrode TGEL and so forth. A source aluminum electrode SEL is formed to cover the interlayer insulating film ILF. The source aluminum electrode SEL is electrically coupled to the source diffusion layer SDL (not illustrated). On the other hand, a drain electrode DEL is formed on/over the other principal surface (a second principal surface) of the semiconductor substrate SUB in contact with the n$^+$-type substrate BSUB. The semiconductor device PSD according to the first embodiment is configured as described above.

Figure 3:
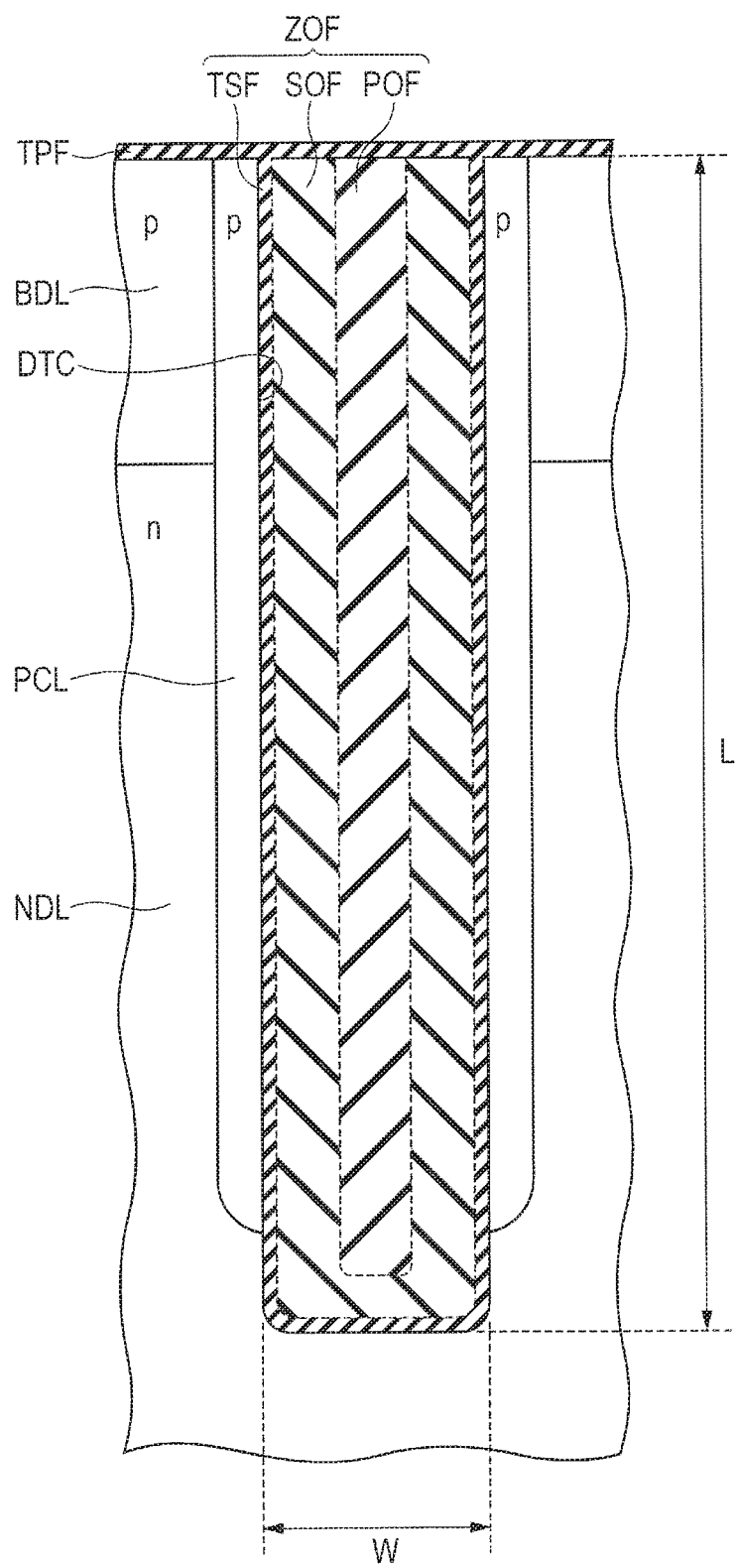
FIG. 3 is a partially enlarged sectional diagram illustrating one example of an embedded insulator formed in a deep trench in the semiconductor device according to the first embodiment.

Then, a structure of the embedded insulator ZOF will be described. The embedded insulator ZOF is configured by a silicon thermal oxide film TSF, a TEOS (Tetra Ethyl Ortho Silicate) oxide film SOF and a silicon oxide film POF as illustrated in FIG. 3. The embedded insulator ZOF is formed by the thermal oxidation treatment performed when forming the protective insulating film TPF.

The silicon thermal oxide film TSF is a film which is formed by thermally oxidizing part of the semiconductor substrate SUB (the p-type column layer PCL and so forth) which is located on an inner-wall surface of the deep trench DTC when performing the thermal oxidation treatment. The TEOS oxide film SOF is a film which is formed in the deep trench DTC by, for example, a CVD method. The silicon oxide film POF is a film which is formed by thermally oxidizing the polycrystalline silicon film formed in the deep trench DTC.

In a case where a width of the deep trench DTC in which the embedded insulator ZOF is formed is denoted by W and a depth (a length) of the deep trench DTC is denoted by L, an aspect ratio (L/W) of the deep trench DTC (or the embedded insulator ZOF) is set to at least about 7. When forming the embedded insulator ZOF in the deep trench DTC by the thermal oxidation treatment, the TEOS oxide film SOF contracts and the polycrystalline silicon film expands, and thereby warpage of the semiconductor substrate SUB is suppressed as will be described later. Incidentally, the aspect ratio of the deep trench DTC is sufficiently large in comparison with a general aspect ratio (not more than about 3) of an STI (Shallow Trench Isolation) region which is used as an element isolation region.

Figure 4:
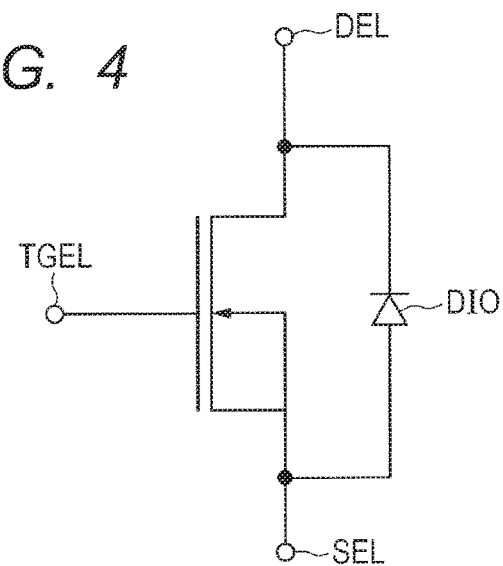
FIG. 4 is a diagram illustrating one example of an equivalent circuit of a MOSFET in the semiconductor device according to the first embodiment.

FIG. 4 illustrates one example of an equivalent circuit of the semiconductor device PSD including the MOSFET. A diode DIO which is configured by the p-type columns layer PCL and the n-type drift layers NDL which are arranged to form the super-junction structure is coupled between the source aluminum electrode SEL and the drain electrode DEL of the MOSFET.

Then, a variety of arrangement patterns of the gate electrode TGEL (the gate trench TRC), the embedded insulator ZOF (the deep trench DTC) and so forth will be described.

Figure 5:
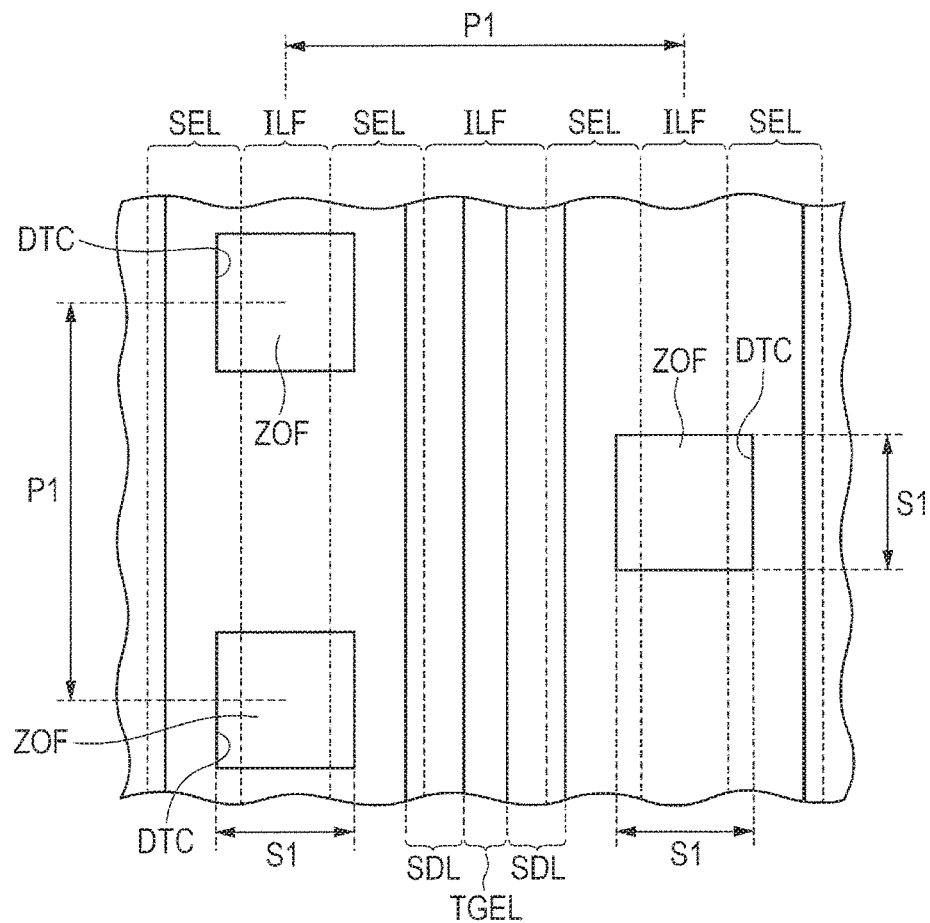
FIG. 5 is a partially enlarged plan view illustrating a first example of a planar layout of the semiconductor device according to the first embodiment.

FIG. 5 illustrates one example of a pattern that the gate electrodes TGEL and the source diffusion layers SDL are arranged in stripes and the embedded insulators ZOF are arranged in dots. A transverse (X-direction) pitch of the embedded insulators ZOF and a longitudinal (Y-direction) pitch of the embedded insulators ZOF are set to the same pitch, that is, a pitch P1. In addition, a planar shape of each embedded insulator ZOF is, for example, a square that each side has a length S1.

Here, it is supposed that, for example, the pitch P1 is about 2.4 μm and the length S1 of the embedded insulator ZOF (the deep trench DTC) is about 0.8 μm. In this case, the rate of the occupation area in which the embedded insulators ZOF (the deep trenches DTC) are arranged will reach about 11% in unit area (the pitch P1×the pitch P1).

Figure 6:
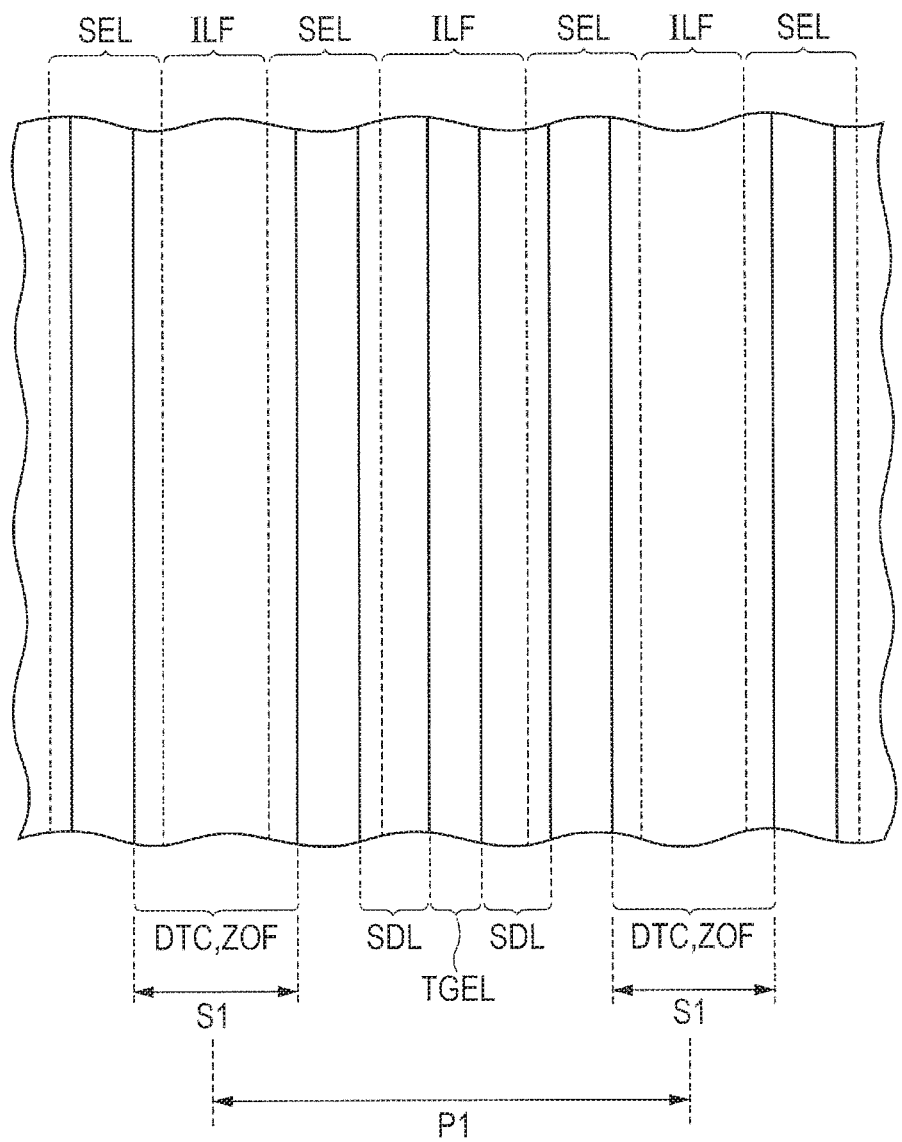
FIG. 6 is a partially enlarged plan view illustrating a second example of the planar layout of the semiconductor device according to the first embodiment.

FIG. 6 illustrates one example of a pattern that the gate electrodes TGEL and the source diffusion layers SDL are arranged in stripes and the embedded insulators ZOF are arranged in stripes. The transverse pitch (the X direction) of the embedded insulators ZOF is set to the pitch P1. A width of each embedded insulator ZOF is set to the length S1.

Here, it is supposed that, for example, the pitch P1 is about 2.4 μm and the length S1 of the embedded insulator ZOF (the deep trench DTC) is about 0.8 μm. In this case, the rate of the occupation area in which the embedded insulators ZOF (the deep trenches DTC) are arranged will reach about 30% in unit area (the pitch P1×the pitch P1).

Figure 7:
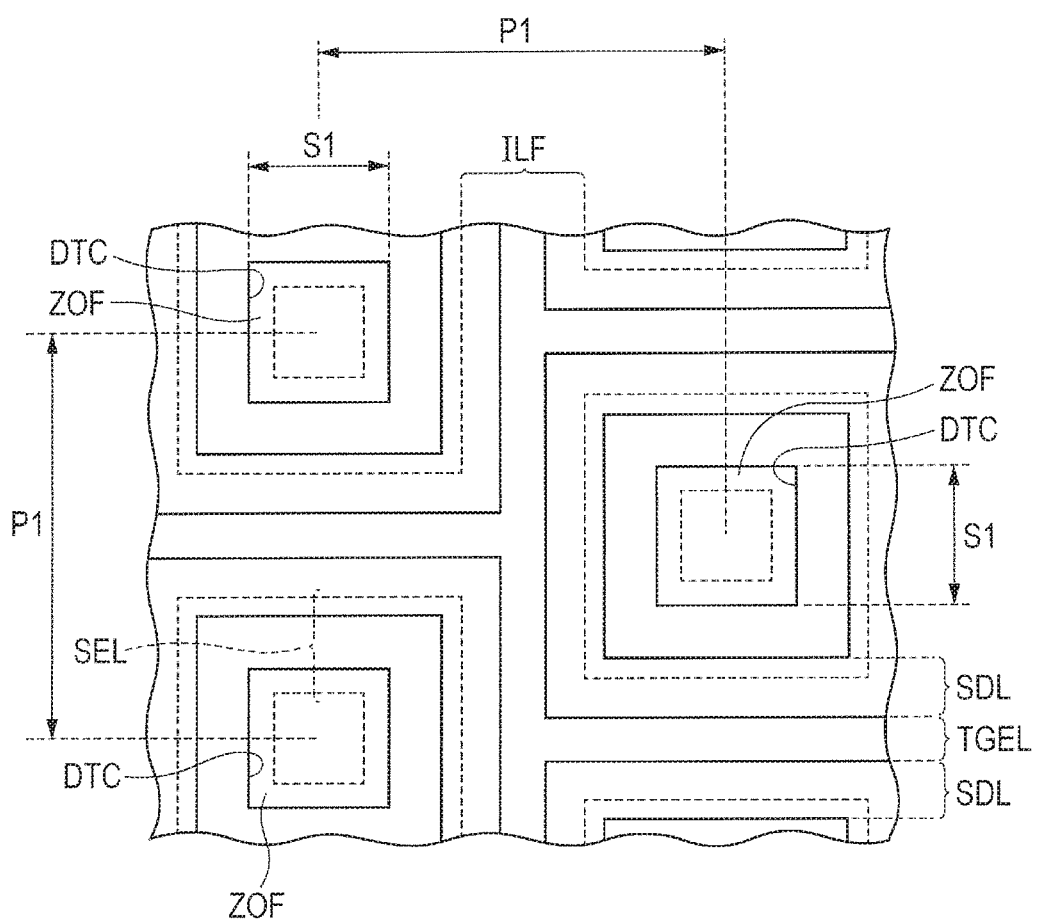
FIG. 7 is a partially enlarged plan view illustrating a third example of the planar layout of the semiconductor device according to the first embodiment.

FIG. 7 illustrates one example of a pattern that the gate electrodes TGEL and the source diffusion layers SDL are arranged in meshes and the embedded insulators ZOF are arranged in dots. The transverse pitch (the X direction) of the embedded insulators ZOF and the longitudinal pitch (the Y direction) of the embedded insulators ZOF are set to the same pitch, that is, the pitch P1 similarly to the pattern illustrated in FIG. 5.

Here, the rate of the occupation area in which the embedded insulators ZOF (the deep trenches DTC) are arranged reaches about 11% in unit area (the pitch P1×the pitch P1) similarly to the case in FIG. 5.

The rate of the occupation area in which the embedded insulators ZOF (the deep trenches DTC) are arranged reaches at least about 10% in unit area (the pitch P1×the pitch P1) as described above in the super-junction structure. This rate is sufficiently large in comparison with the general corresponding rate of the occupation area of the element isolation region in which the element isolation insulating films are arranged and is recognized as a characteristic of the super-junction structure.

Incidentally, this rate corresponds to a rate of a total occupation area obtained by adding together occupations areas in each of which each embedded insulator ZOF (the deep trench DTC) is arranged in the element region EFR. In addition, although a case where the planer shape of each of the embedded insulators ZOF (the deep trenches DTC) which are arranged in dots is almost square is given by way of example, the planer shape may be, for example, a rectangle, an octagon, a circle and so forth in addition to the square.

Figure 8:
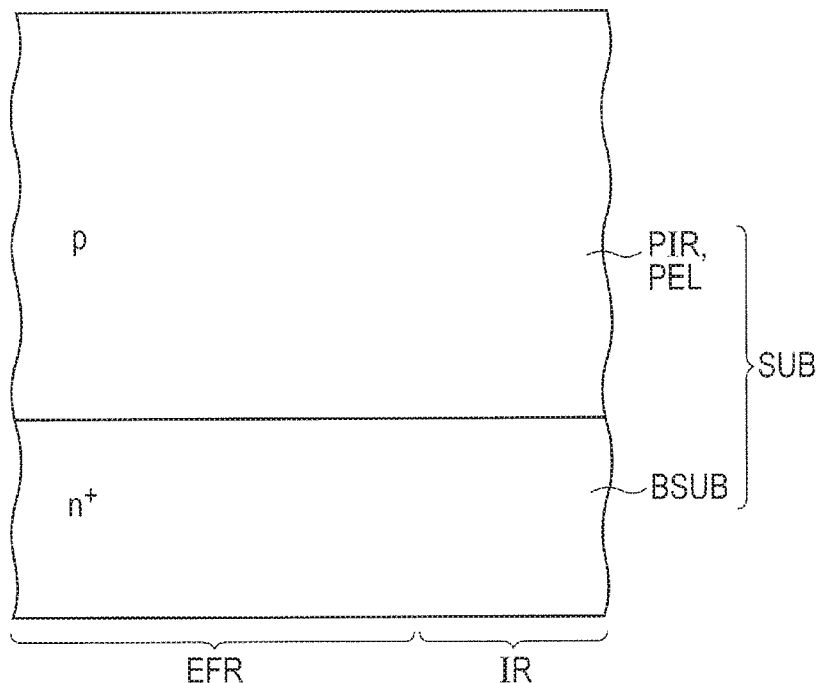
FIG. 8 is a sectional diagram illustrating one example of one process of a manufacturing method for the semiconductor device according to the first embodiment.

Then, one example of a manufacturing method for the semiconductor device PSD according to the first embodiment will be described. First, the p-type epitaxial layer PEL is formed on a front surface of the n$^+$-type substrate BSUB by, for example, an epitaxially growing method as illustrated in FIG. 8. The part of the p-type epitaxial layer PEL serves as the p-type isolation layer PIR (see FIG. 2).

Then, a gate trench (not illustrated) which reaches a predetermined depth from a front surface of the p-type epitaxial layer PEL is formed in the element region EFR which is defined by the p-type epitaxial layer PEL (the semiconductor substrate SUB). Then, thermal oxidation treatment is performed and thereby a silicon oxide film (not illustrated) is formed on/over the front surface of the p-type epitaxial layer PEL including part of the p-type epitaxial layer PEL which is exposed into the gate trench. Then, a polycrystalline silicon film (not illustrated) is formed to fill the gate trench.

Figure 9:
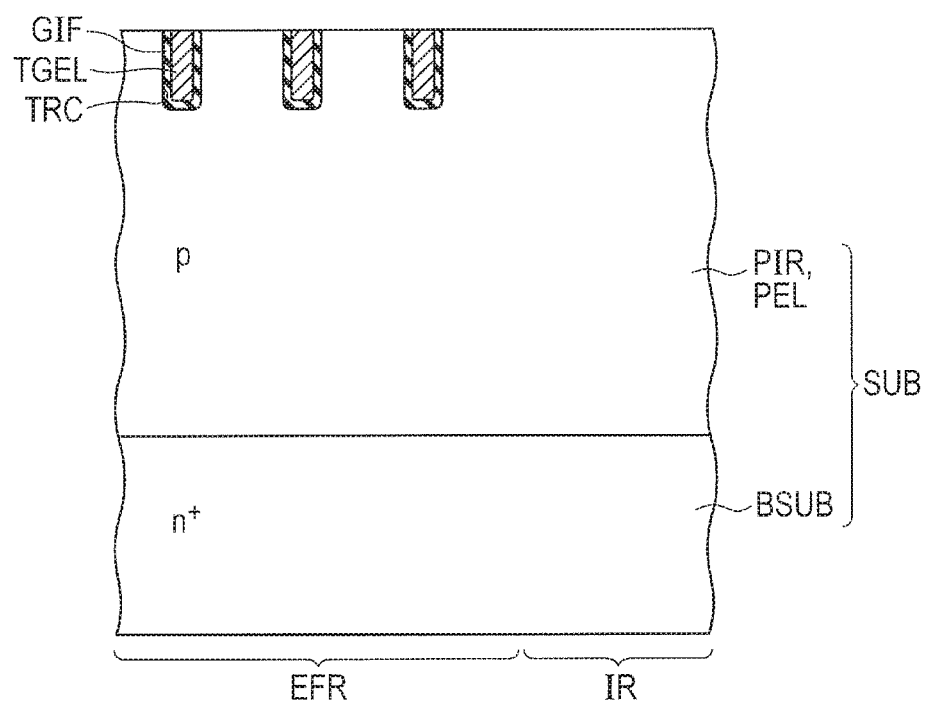
FIG. 9 is a sectional diagram illustrating one example of a process performed after performance of the process illustrated in FIG. 8 in the manufacturing method for the semiconductor device according to the first embodiment.

Then, part of the silicon oxide film and part of the polycrystalline silicon film which are located on the front surface of the p-type epitaxial layer PEL are removed. Thereby, part of the silicon oxide film which is left unremoved in the gate trench TRC is formed as the gate insulating film GIF as illustrated in FIG. 9. In addition, part of the polycrystalline silicon film which is left unremoved in the gate trench TRC is formed as the gate electrode TGEL.

Then, the thermal oxidation treatment is performed and thereby a protective insulating film IPF (see FIG. 10) is formed on the front surface of the p-type epitaxial layer PEL. Then, for example, predetermined photoengraving treatment and etching treatment are performed and thereby the deep trenches DTC (see FIG. 10) are formed in the element region EFR. Each deep trench DTC has a width corresponding to the width W (see FIG. 3) and is formed to reach a depth corresponding to the predetermined depth L (see FIG. 3) from the front surface of the p-type epitaxial layer PEL (the semiconductor substrate SUB).

Figure 10:
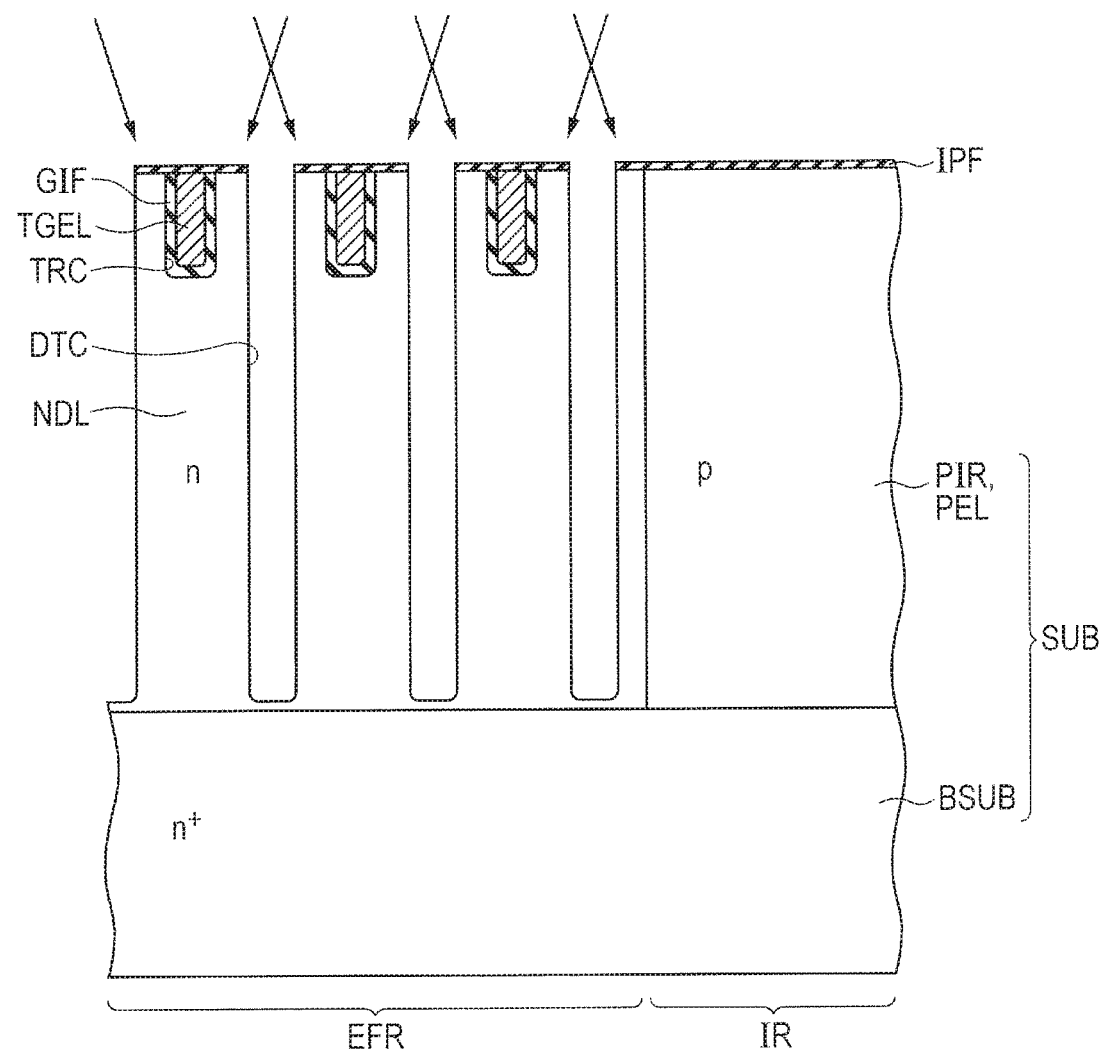
FIG. 10 is a sectional diagram illustrating one example of a process performed after performance of the process illustrated in FIG. 9 in the manufacturing method for the semiconductor device according to the first embodiment.

Then, n-type impurities are obliquely implanted into the semiconductor substrate SUB via the protective insulating film IPF and the deep trenches DTC. In this situation, the isolation region IR is covered with a photoresist film (not illustrated). The photoresist film is removed, then the thermal oxidation treatment is performed and thereby the n-type drift layer NDL is formed in the element region EFR as illustrated in FIG. 10. Incidentally, for example, an insulating film which is thick enough not to allow penetration of the n-type impurities may be formed in addition to the photoresist film.

Figure 11:
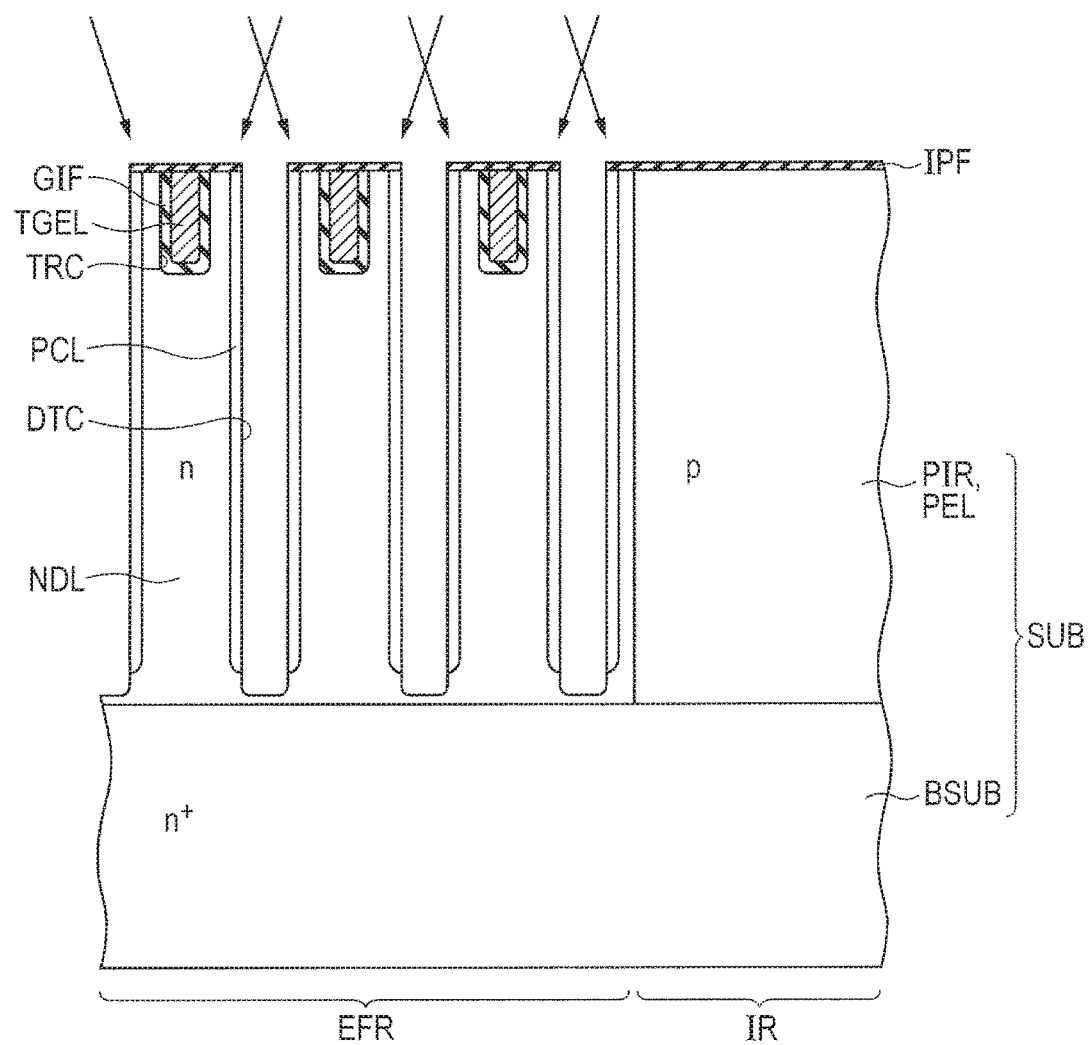
FIG. 11 is a sectional diagram illustrating one example of a process performed after performance of the process illustrated in FIG. 10 in the manufacturing method for the semiconductor device according to the first embodiment.

Then, p-type impurities are obliquely implanted into the semiconductor substrate SUB via the protective insulating film IPF and the deep trenches DTC. In this situation, the isolation region IR is covered with the photoresist film (not illustrated). The photoresist film is removed, then the thermal oxidation treatment is performed and thereby the p-type column layer PCL is formed along each of sidewall surfaces (hereinafter, generally referred to as the sidewall surface) of each deep trench DTC as illustrated in FIG. 11. The p-type column layer PCL is formed on part of the n-type drift layer NDL which extends along the sidewall surface of the deep trench DTC while maintaining an almost constant width. Incidentally, for example, an insulating film which is thick enough not to allow penetration of the p-type impurities may be formed in addition to the photoresist film.

Figure 12:
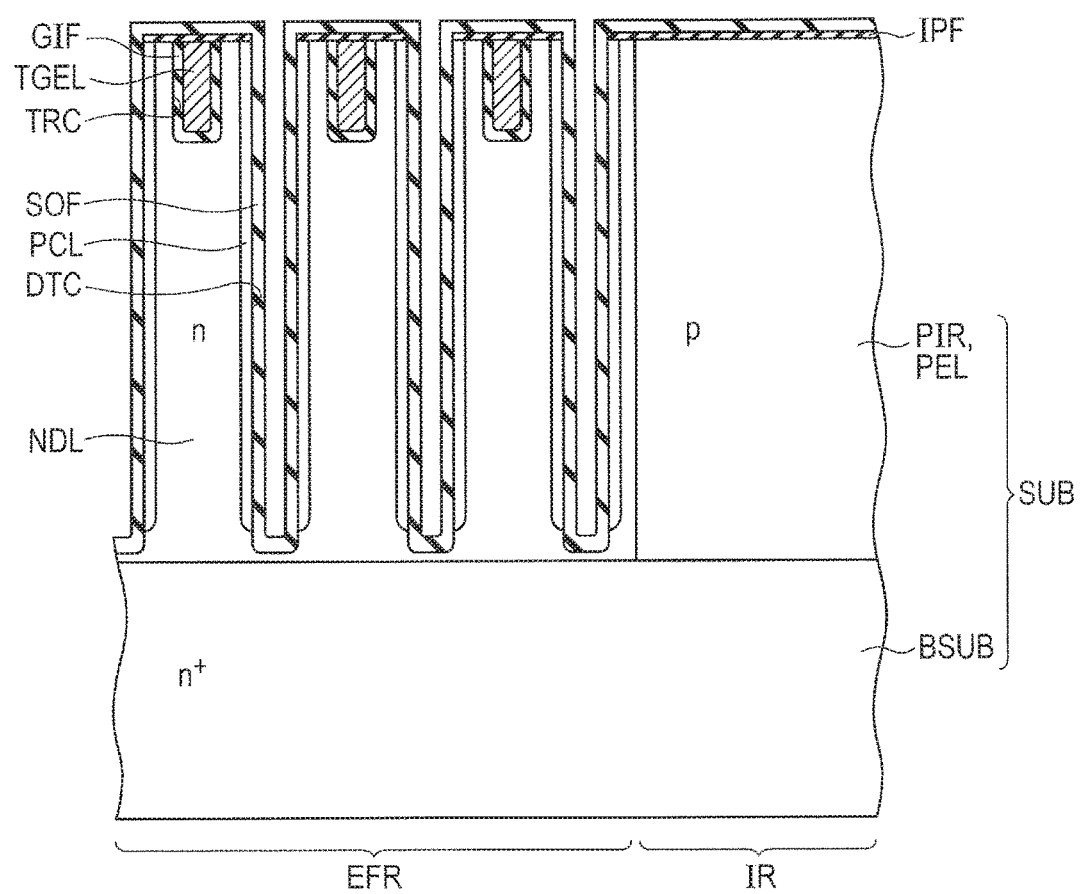
FIG. 12 is a sectional diagram illustrating one example of a process performed after performance of the process illustrated in FIG. 11 in the manufacturing method for the semiconductor device according to the first embodiment.

Then, the TEOS oxide film SOF is formed by, for example, the CVC method as illustrated in FIG. 12. The TEOS oxide film SOF is formed in contact with an innerwall surface of each deep trench DTC including the sidewall surface (the p-type column layer PCL) thereof. The TEOS oxide film SOF has such a property that it contracts by being subjected to the thermal oxidation treatment as will be described later.

Figure 13:
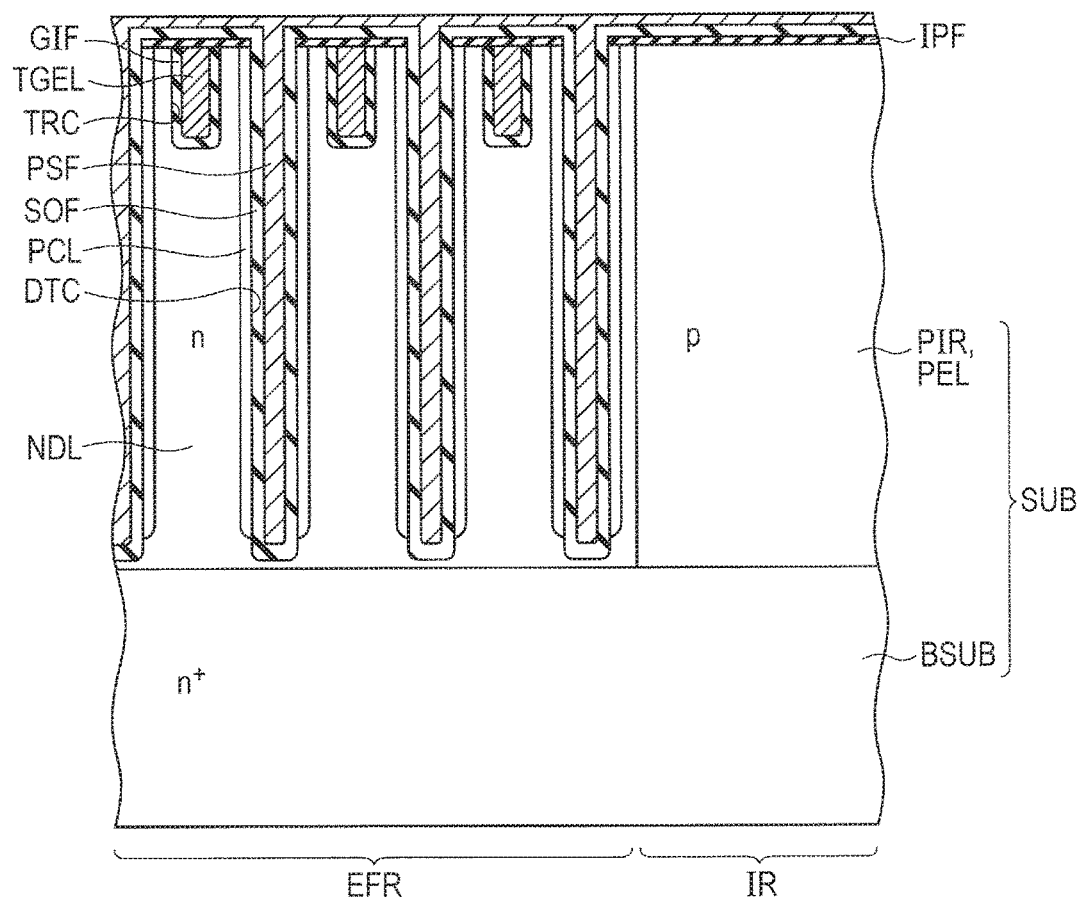
FIG. 13 is a sectional diagram illustrating one example of a process performed after performance of the process illustrated in FIG. 12 in the manufacturing method for the semiconductor device according to the first embodiment.
Figure 14:
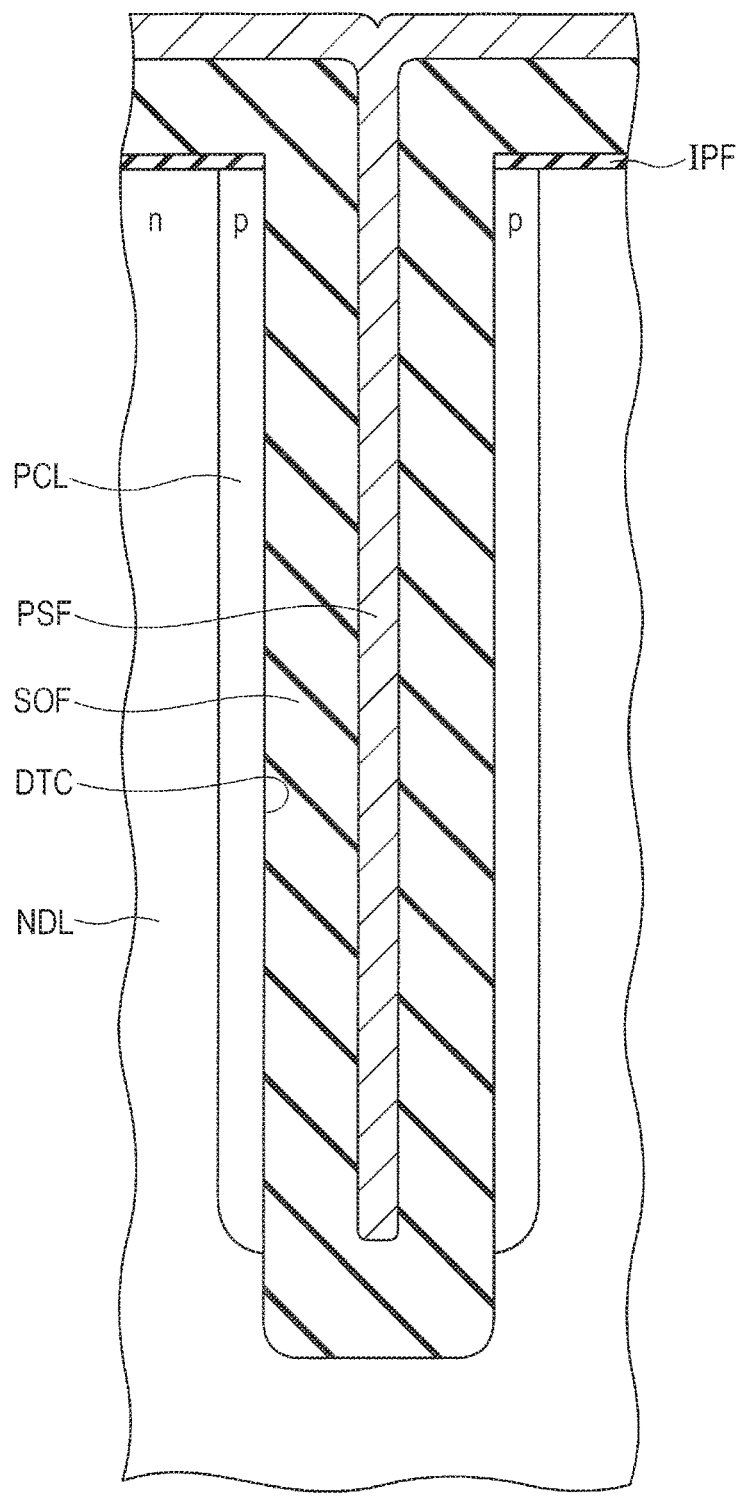
FIG. 14 is a partially enlarged sectional diagram illustrating one example of a structure in a deep trench in the process illustrated in FIG. 13 in the manufacturing method for the semiconductor device according to the first embodiment.

Then, a polycrystalline silicon film PSE is formed by, for example, the CVD method as illustrated in FIG. 13. In this situation, the polycrystalline silicon film PSF is formed in contact with the TEOS oxide film SOF in a state of filling the deep trench DTC as illustrated in FIG. 14. The polycrystalline silicon film PSF has such a property that it expands by being subjected to the thermal oxidation treatment as will be described later.

Figure 15:
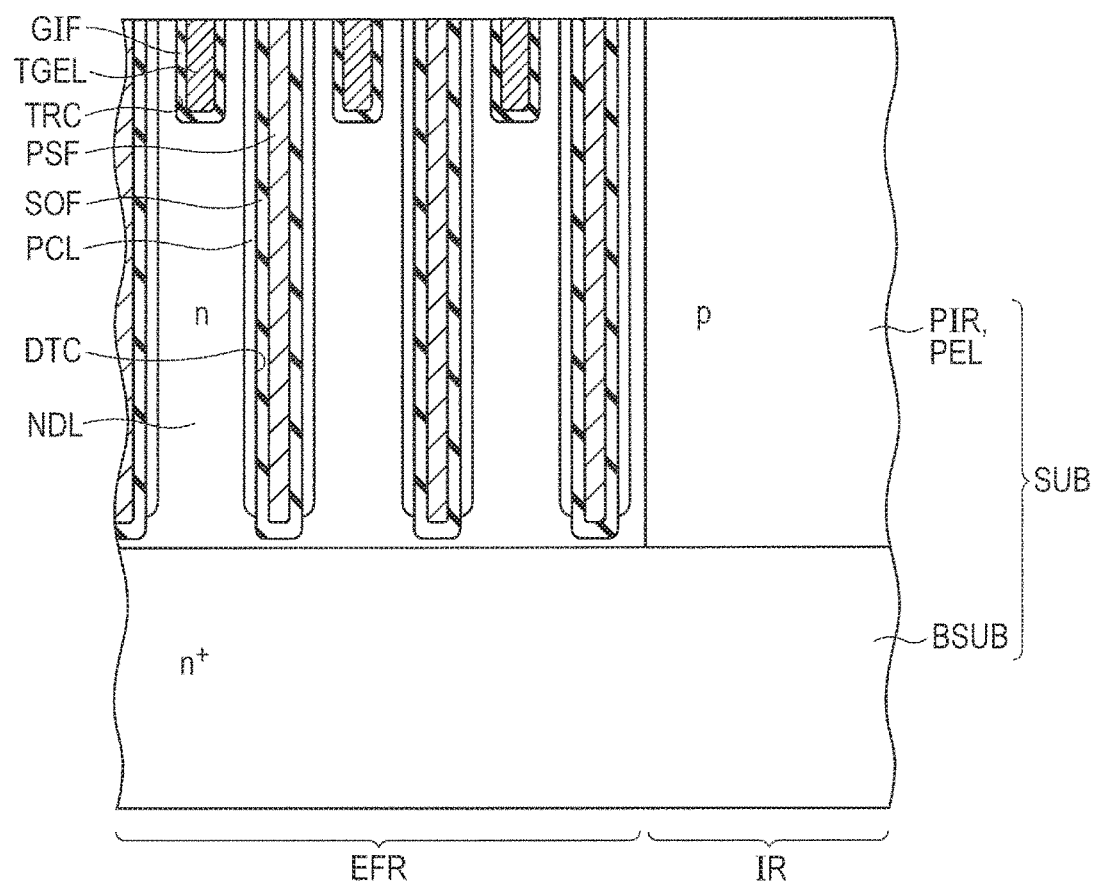
FIG. 15 is a sectional diagram illustrating one example of a process performed after performance of the processes illustrated in FIG. 13 and FIG. 14 in the manufacturing method for the semiconductor device according to the first embodiment.

Then, for example, Chemical Mechanical Polishing (CMP) is performed and thereby part of the polycrystalline silicon film PSF, part of the TEOS oxide film SOF and part of the protective insulating film IPF which are located on the front surface (the first principal surface) of the semiconductor substrate SUB (the n-type drift layer NDL and so forth) are removed as illustrated in FIG. 15.

Figure 16:
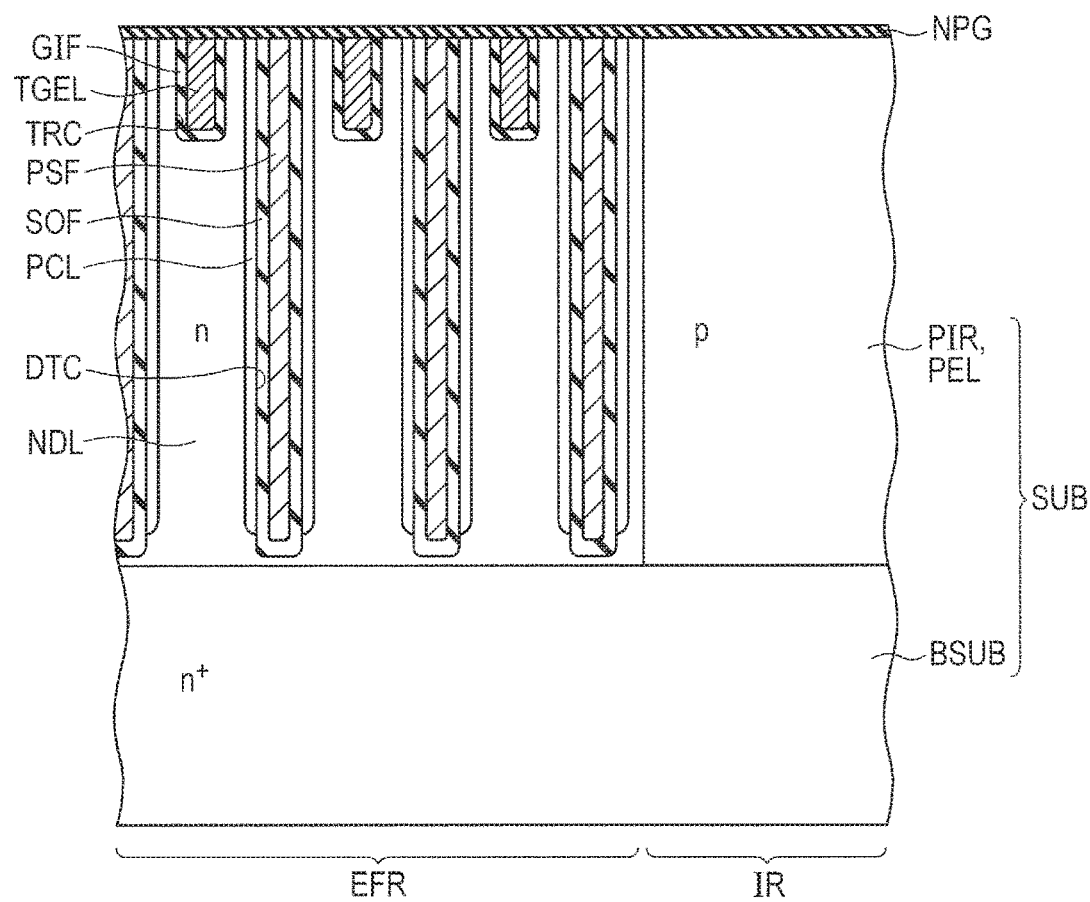
FIG. 16 is a sectional diagram illustrating one example of a process performed after performance of the process illustrated in FIG. 15 in the manufacturing method for the semiconductor device according to the first embodiment.
Figure 17:
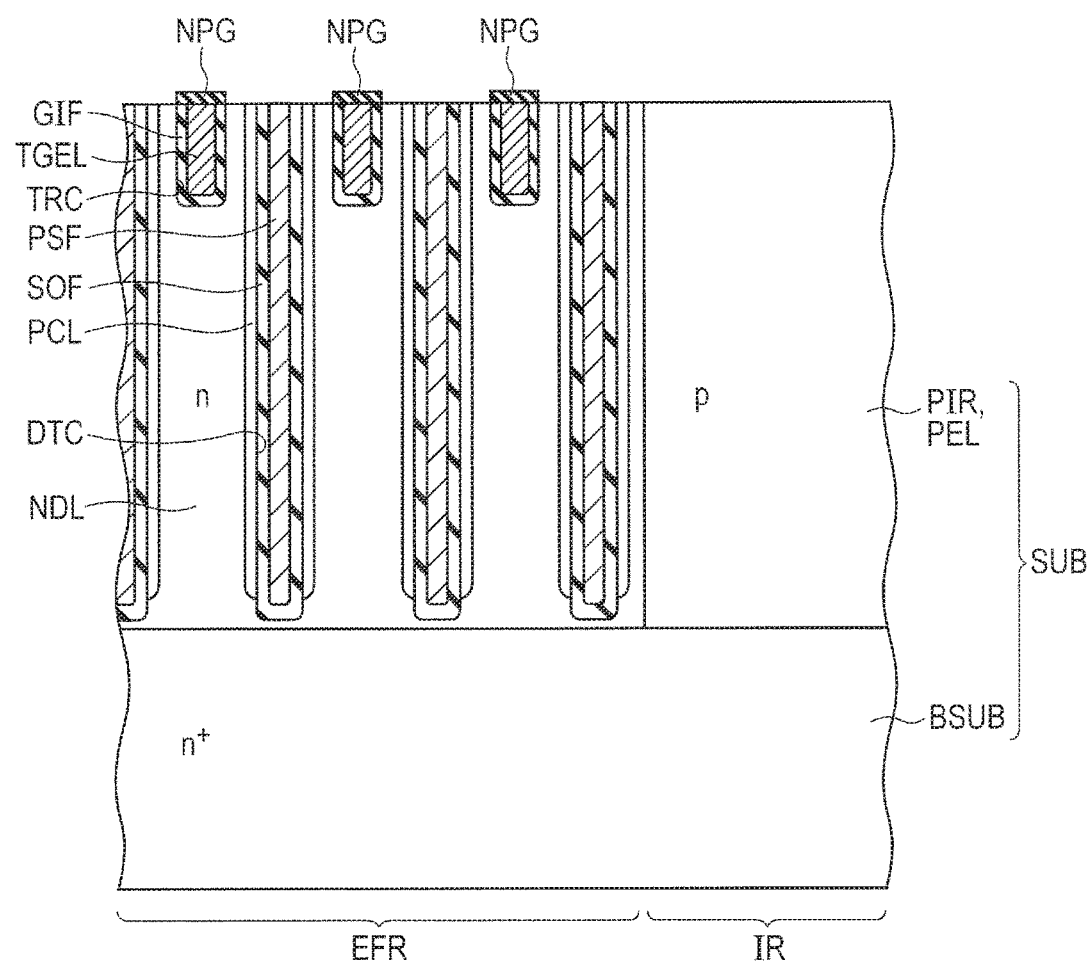
FIG. 17 is a sectional diagram illustrating one example of a process performed after performance of the process illustrated in FIG. 16 in the manufacturing method for the semiconductor device according to the first embodiment.

Then, the silicon nitride film NPG is formed to cover the front surface (the first principal surface) of the semiconductor substrate SUB (the n-type drift layer NDL and so forth) by, for example, the CVD method as illustrated in FIG. 16. The silicon nitride film NPG has a function of blocking oxidation of the gate electrode TGEL when subjected to the thermal oxidation treatment as will be described later. Then, for example, the predetermined photoengraving treatment and etching treatment are performed and thereby the silicon nitride film NPG is removed with the part which covers the gate electrode TGEL being left unremoved as illustrated in FIG. 17.

Figure 18:
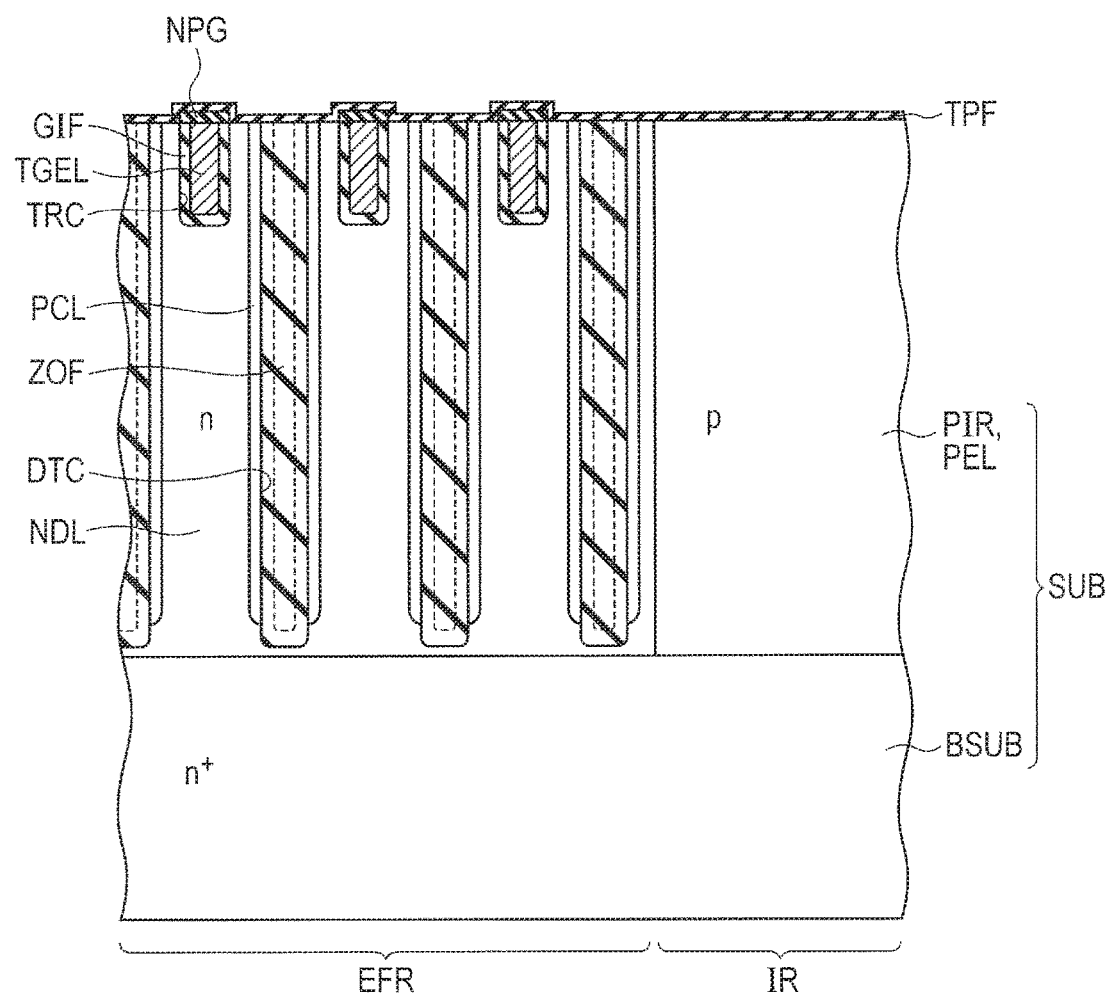
FIG. 18 is a sectional diagram illustrating one example of a process performed after performance of the process illustrated in FIG. 17 in the manufacturing method for the semiconductor device according to the first embodiment.

Then, the thermal oxidation treatment is performed, for example, in a wet atmosphere of a temperature of about 900° C. and thereby the exposed front surface (the first principal surface) of the semiconductor substrate SUB (the n-type drift layer NDL and so forth) is oxidized and the protective insulating film TPF is formed as illustrated in FIG. 18. The protective insulating film TRF has a function of suppressing damage which would occur when performing ion implantation.

Figure 19:
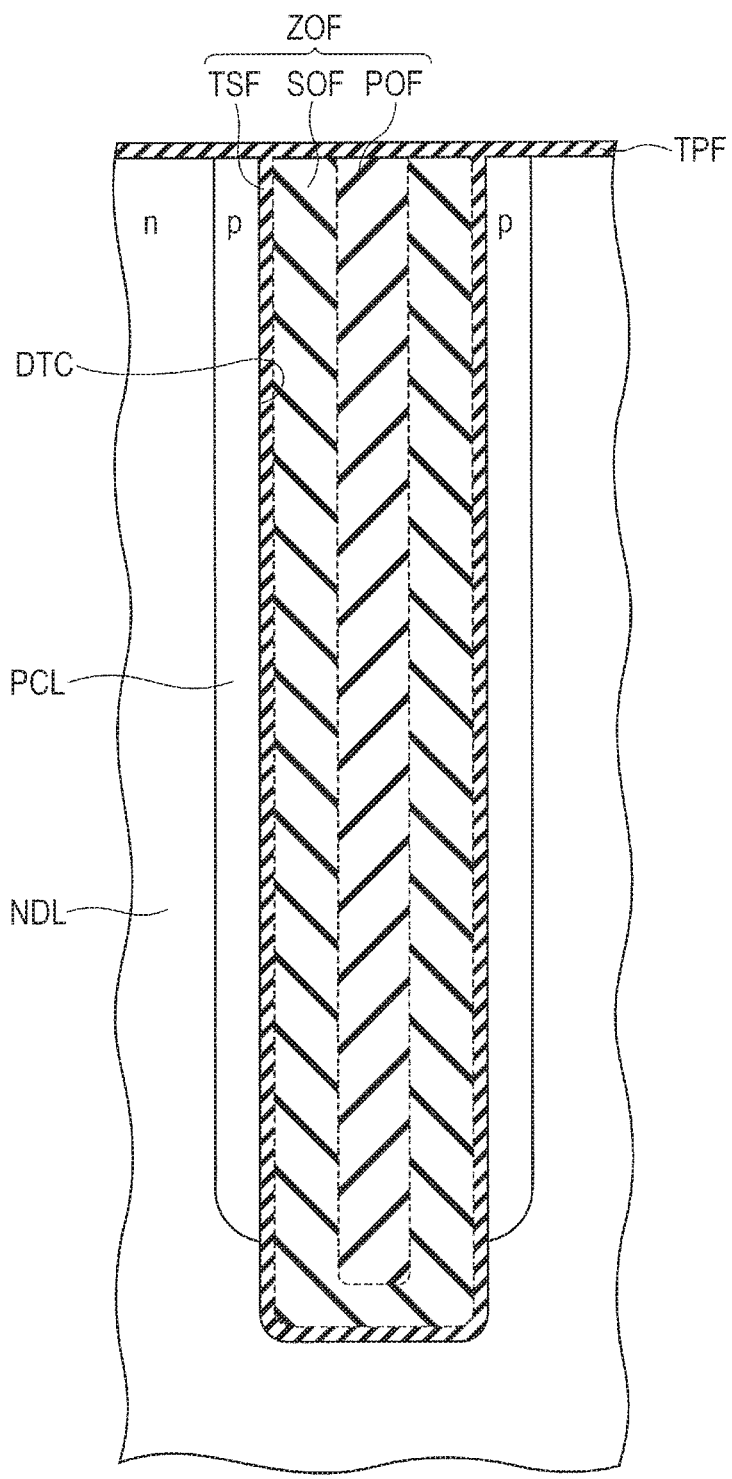
FIG. 19 is a partially enlarged sectional diagram illustrating one example of the structure in the deep trench in the process illustrated in FIG. 18 in the manufacturing method for the semiconductor device according to the first embodiment.

In this situation, the embedded insulator ZOF is formed in the deep trench DTC as illustrated in FIG. 19. The TEOS film SOF contracts by being subjected to the thermal oxidation treatment in the deep trench DTC. The polycrystalline silicon film PSF is oxidized and thereby the silicon oxide film POF is formed. The polycrystalline silicon film PSF expands when thermally oxidized.

In addition, oxidation progresses first from part of the semiconductor substrate ZUB (the p-type column layer PCL) which is in contact with the TEOS oxide film SOF by being subjected to the thermal oxidation treatment and thereby the silicon thermal oxide film TSF is formed. The silicon thermal oxide film TSF includes part which is oxidized from the inner-wall surface (the semiconductor substrate SUB) of the deep trench DTC toward the p-type column layer PCL and part which grows toward the TEOS oxide film SOF.

Here, a film thickness of the TEOS oxide film SOF and a film thickness of the polycrystalline silicon film PSF are set in such a manner that an amount by which the TEOS oxide film SOF contracts when thermally oxidized is cancelled out by an amount by which the polycrystalline silicon film PSF expands and an amount by which the silicon thermal oxide film TSF grows toward the TEOS oxide film SOF when thermally oxidized. The embedded insulator ZOF is formed in the deep trench DTC in this way as illustrated in FIG. 19.

On the other hand, on the side of the gate electrode TGEL, since the gate electrode TGEL is covered with the silicon nitride film NPG, oxidation of the part of the silicon oxide film which is left unremoved in the gate trench TRC and forms the gate insulating film GIF and the part of the polycrystalline silicon film which is left unremoved in the gate trench TRC and forms the gate electrode TGEL is blocked.

Then, a photoresist pattern (not illustrated) through which a region in which the base diffusion layer BDL will be formed is exposed is formed by performing, for example, the predetermined photoengraving treatment. The p-type impurities are implanted into the semiconductor substrate SUB via the protective insulating film TPF by using the photoresist pattern as an implantation mask and thereby the p-type base diffusion layer BDL is formed (see FIG. 20). In this case, damage caused by implantation of the p-type impurities is suppressed by the protective insulating film TPF. Thereafter, the photoresist pattern is removed.

Then, a photoresist pattern (not illustrated) through which a region in which the source diffusion layer SDL will be formed is exposed is formed by performing, for example, the predetermined photoengraving treatment. The n-type impurities are implanted into the semiconductor substrate SUB via the protective insulating film TPF by using the photoresist pattern as the implantation mask and thereby the n-type source diffusion layer SDL is formed (see FIG. 20). In this case, the damage caused by implantation of the n-type impurities is suppressed by the protective insulating film TPF. Thereafter, the photoresist pattern is removed.

Figure 20:
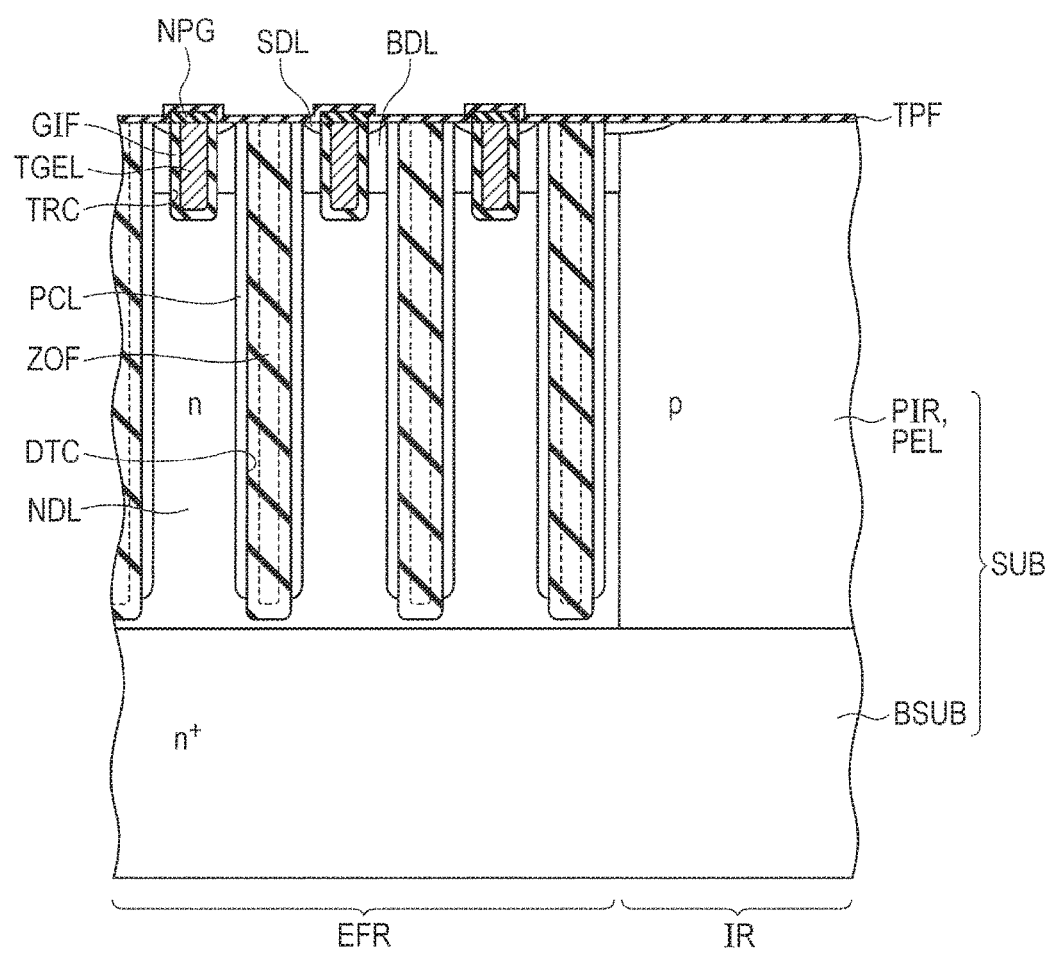
FIG. 20 is a sectional diagram illustrating one example of a process performed after performance of the processes illustrated in FIG. 18 and FIG. 19 in the manufacturing method for the semiconductor device according to the first embodiment.

The base diffusion layer BDL is formed from the front surface (the first principal surface) of the semiconductor substrate SUB (the n-type drift layer NDL) deep into the semiconductor substrate SUB across the zone which is shallower than the bottom (the depth) of the gate trench TRC in this way as illustrated in FIG. 20. In addition, the source diffusion layer SDL is formed from the surface of the base diffusion layer BDL deep into the base diffusion layer BDL across a zone which is shallower than the bottom of the base diffusion layer BDL. At this point in time, each gate trench TRC in which the gate electrode TGEL and so forth are formed is positioned to reach the n-type drift layer NDL passing through the base diffusion layer BDL and the source diffusion layer SDL.

Then, an insulating film (not illustrated) which will serve as an interlayer insulating film is formed to cover the semiconductor substrate SUB (the protective insulating film TPF). The interlayer insulating film ILF is formed by performing, for example, the predetermined photoengraving treatment and etching treatment on the insulating film (see FIG. 21). The interlayer insulating film ILF is formed to cover part of the gate electrode TGEL, part of the embedded insulator ZOF and so forth as illustrated in FIG. 21.

Figure 21:
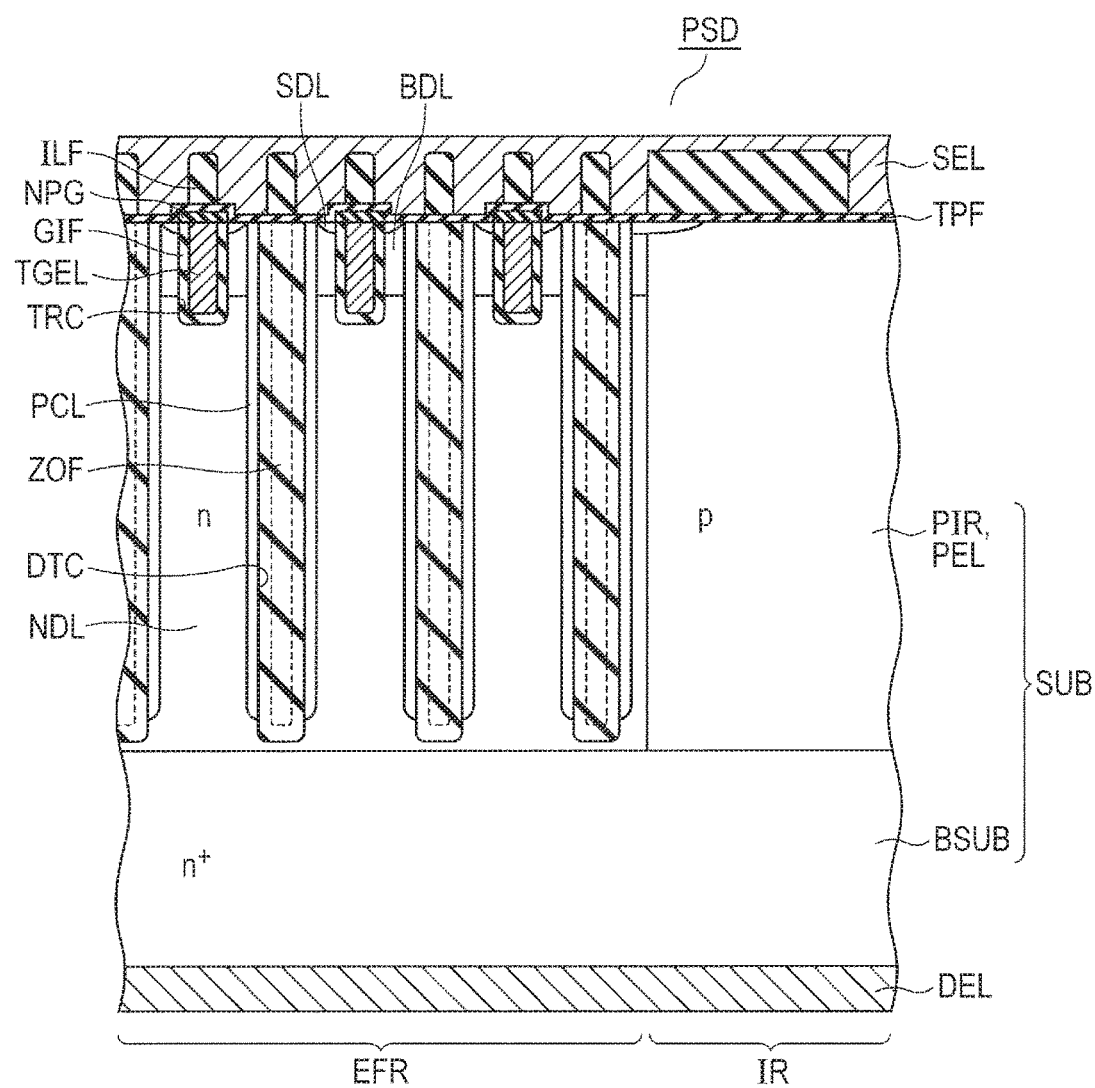
FIG. 21 is a sectional diagram illustrating one example of a process performed after performance of the process illustrated in FIG. 20 in the manufacturing method for the semiconductor device according to the first embodiment.

Then, the source aluminum electrode SEL is formed by, for example, a sputtering method and so forth as illustrated in FIG. 21. Incidentally, although the protective insulating film TPF is located between the source aluminum electrode SEL and the source diffusion layer SDL in FIG. 21, the source aluminum electrode SEL is electrically coupled to the source diffusion layer SDL. Then, the drain electrode DEL is formed on a rear surface (the second principal surface) of the semiconductor substrate SUB by, for example, the sputtering method and so forth. Formation of main parts of the semiconductor device PSD is completed in this way.

In the above-described semiconductor device PSD according to the first embodiment, it is possible to suppress warpage of the semiconductor substrate SUB which would occur when forming the embedded insulator ZOF in the deep trench DTC. In addition, it is also possible to suppress the warpage of the semiconductor substrate SUB also after formation of the embedded insulator ZOF in the deep trench DTC. Warpage suppression which is attained in the semiconductor device PSD according to the first embodiment will be described in comparison with semiconductor devices according to comparative examples which are configured to suppress the warpage of the semiconductor substrate which would occur when filling a deep trench.

Figure 22:
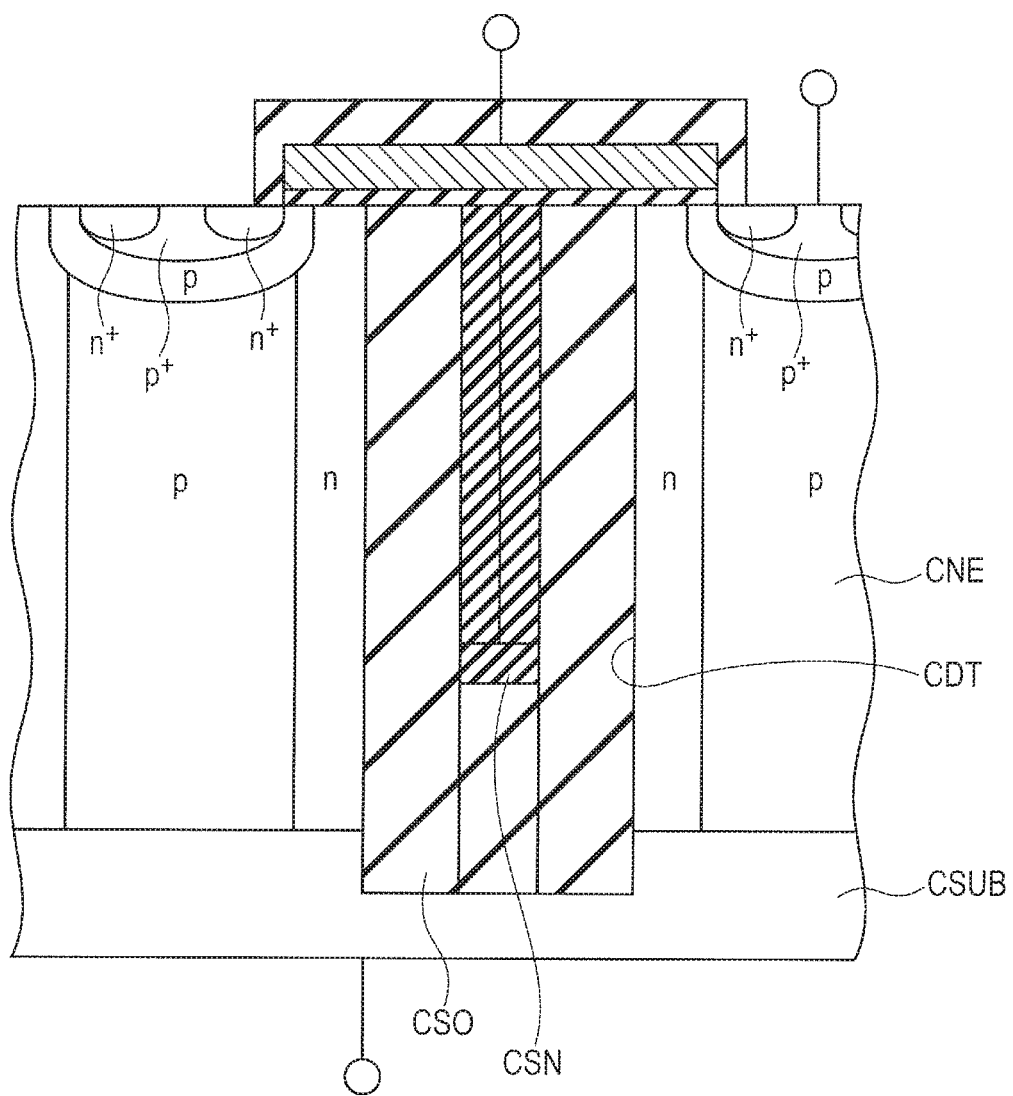
FIG. 22 is a partially enlarged sectional diagram illustrating one example of a semiconductor device according to a first comparative example.

First, the semiconductor device according to a first comparative example will be described. In the first comparative example, an epitaxial layer CNE is formed on a front surface of a silicon substrate CSUB as illustrated in FIG. 22. A trench CDT which reaches the silicon substrate CSUB is formed in the epitaxial layer CNE. A silicon oxide film CSO and a silicon nitride film CSN are formed in the trench CDT.

Figure 23:
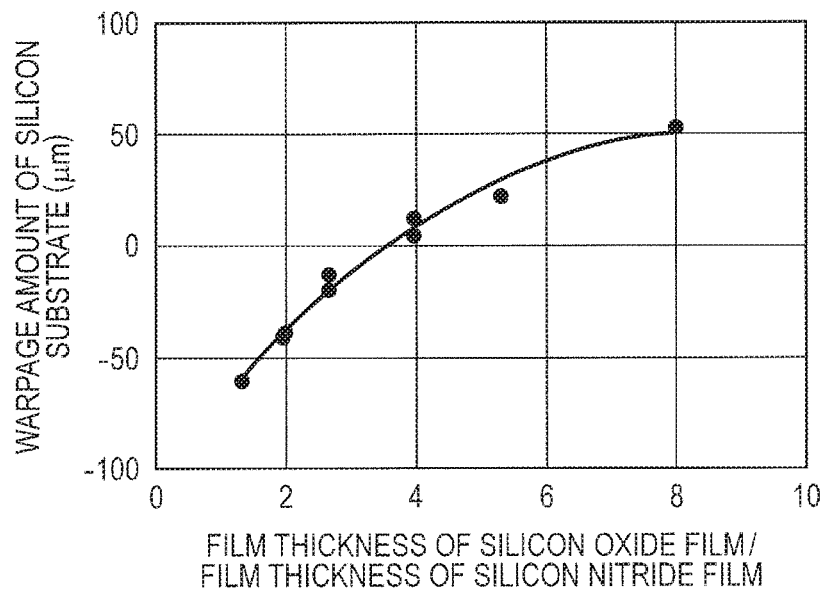
FIG. 23 is a graph illustrating one example of a relation between a ratio of a film thickness of a silicon oxide film to a film thickness of a silicon nitride film and a warpage amount of a silicon substrate in the semiconductor device according to the first comparative example.
Figure 24:
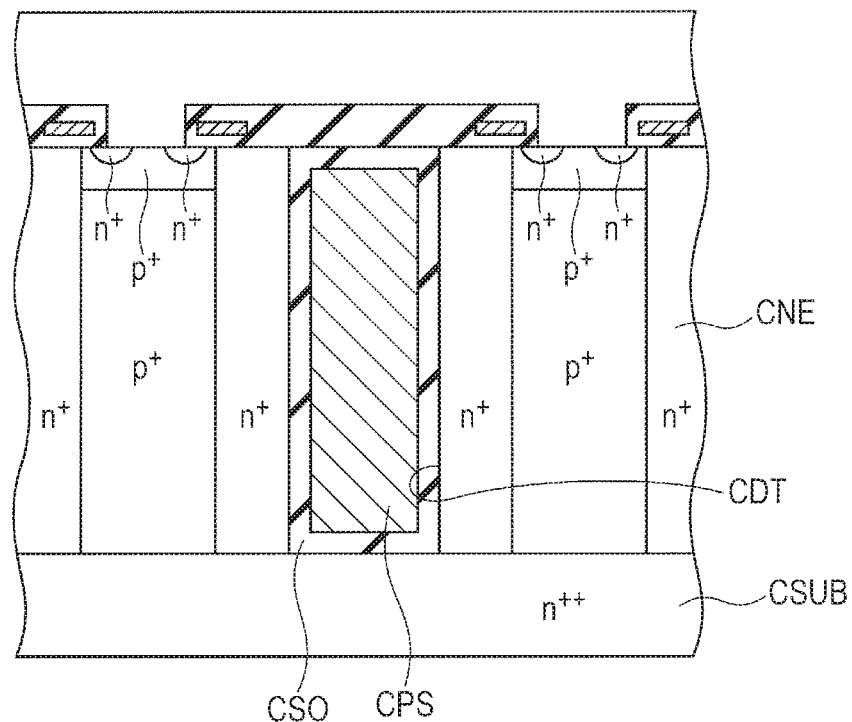
FIG. 24 is a partially enlarged sectional diagram illustrating one example of a semiconductor device according to a second comparative example.

In this situation, a film thickness ratio of a film thickness of the silicon oxide film CSO to a film thickness of the silicon nitride film CSN is adjusted and thereby a stress on the silicon oxide film CSO is released by the silicon nitride film CSN and the warpage of the silicon substrate (the silicon substrate CSUB and the epitaxial layer CNE) is suppressed as illustrated in FIG. 23.

In the above-described trench-filling technique according to the first comparative example, the silicon oxide film CSO contracts and, in contrast, the silicon nitride film CSN expands in a state where the thermal oxidation treatment is being performed and thereby the warpage of the silicon substrate CSUB is suppressed. However, after completion of the thermal oxidation treatment, the contracted silicon oxide film CSO maintains the contracted state and, in contrast, the expanded silicon nitride film CSN contracts and returns to its original state. For this reason, there is a possibility that the silicon substrate CSUB may warp after performing the thermal oxidation treatment. Further, the warpage of the silicon substrate becomes one of causes of leakage current.

Then, the semiconductor device according to a second comparative example will be described. In the second comparative example, the epitaxial layer CNE is formed on the front surface of the silicon substrate CSUB. The trench CDT which reaches the silicon substrate CSUB is formed in the epitaxial layer CNB. The silicon oxide film CSO and a polycrystalline silicon film CPS are formed in the trench CDT.

In the above-described trench-filling technique according to the second comparative example, since a thermal expansion coefficient of the polycrystalline silicon film CPS is equal to a thermal expansion coefficient of the semiconductor substrate (the silicon substrate CSUB and the epitaxial layer CNE), the warpage of the semiconductor substrate which would occur when the thermal oxidation treatment is performed is suppressed.

However, in the trench-filling technique according to the second comparative example, the polycrystalline silicon film CPS is electroconductive and therefore a potential of the polycrystalline silicon film CPS is fixed to a definite potential between a source potential and a drain potential. For this reason, a distribution of depth-direction field intensity of a semiconductor layer (a column layer) which is located on each side of the deep trench becomes ununiform and therefore there is a possibility that the withstand voltage may not be secured as the super-junction structure. In addition, in a case where the film thickness of the silicon oxide film CSO which is located between the polycrystalline silicon film CPS and the semiconductor layer is thin, there is a possibility that dielectric breakdown may occur.

In contrast to the semiconductor devices according to the comparative examples, in the semiconductor device PSD according to the first embodiment, the TEOS oxide film SOF is formed in the deep trench DTC by, for example, the CVD method and further the polycrystalline silicon film PSF is formed to cover the TEOS oxide film SOF. Thereafter, the thermal oxidation treatment for formation of the protective insulating film TPF which suppresses the damage caused by ion implantation is performed.

Figure 25:
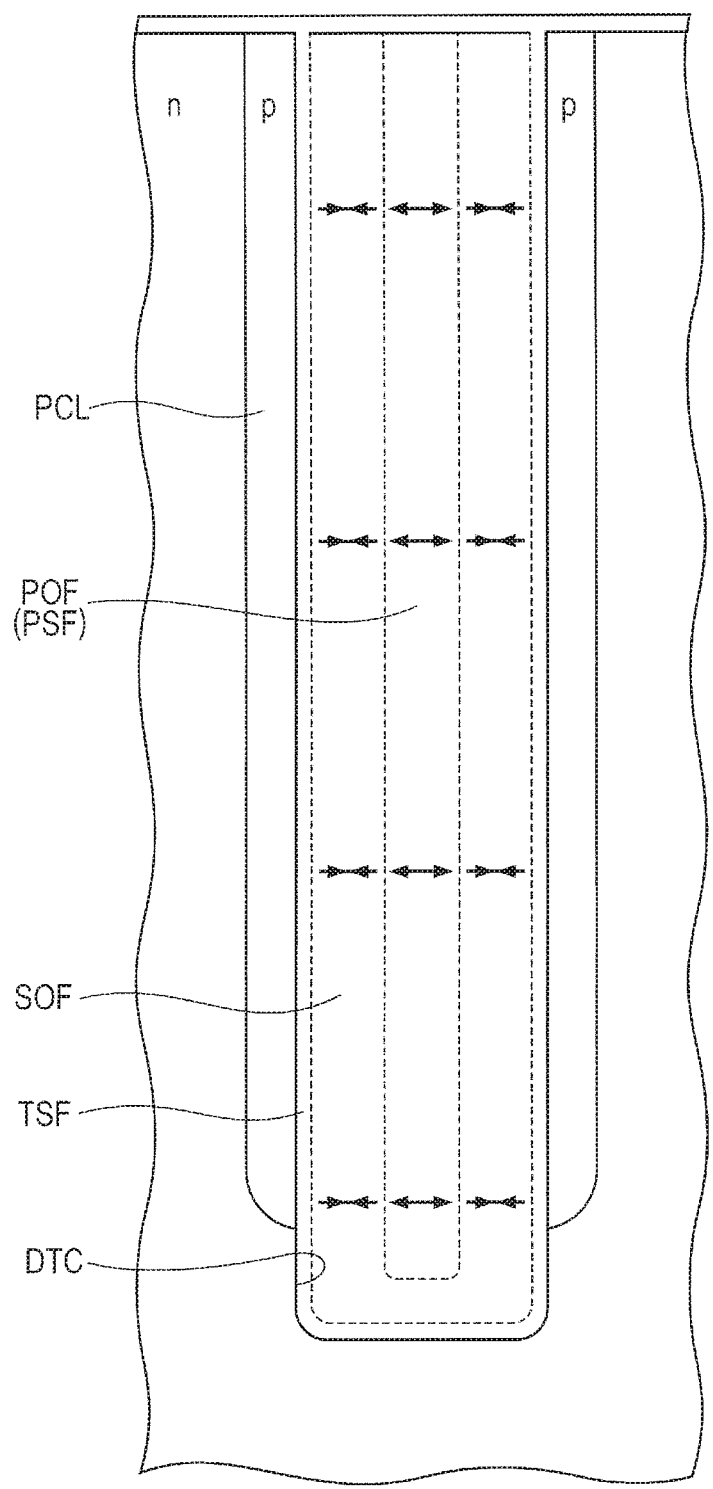
FIG. 25 is a partially enlarged sectional diagram schematically illustrating one example of the structure in the deep trench for explaining operational advantages of the semiconductor device according to the first embodiment.

In this situation, the thermal oxidation treatment is performed, for example, in the wet atmosphere of the temperature of about 900° C. and thereby the TEOS oxide film SOF contracts in the deep trench DTC (see inward arrows) as illustrated in FIG. 25. The polycrystalline silicon film PSF is thermally oxidized and thereby the silicon oxide film POF is formed. The polycrystalline silicon film PSF expands when thermally oxidized (see outward arrows).

In addition, the oxidation progresses first from the part of the semiconductor substrate SUB (the p-type column layer PCL) which is in contact with the TEOS oxide film SOF by the thermal oxidation treatment and thereby the silicon thermal oxide film TSF is formed. The silicon thermal oxide film TSF includes the part which is oxidized from the inner-wall surface (the semiconductor substrate SUB) of the deep trench DTC toward the p-type column layer PCL and the part which grows toward the TEOS oxide film SOF.

Here, for example, in a case where a width of the deep trench DTC is about 0.8 μm (800 nm), a film thickness of the polycrystalline silicon film PSF reaches about 20 nm. In a case where the polycrystalline silicon film PSF is thermally oxidized, the silicon oxide film POF expands and a film thickness thereof is increased to about 45 nm.

The amount by which the polycrystalline silicon film PSF expands, the amount by which the TEOS oxide film SOF contracts and the amount by which the silicon thermal oxide film TSF grows when thermally oxidized are taken into consideration for the width of the deep trench DTC and thereby the film thickness of the TEOS oxide film SOF and the film thickness of the polycrystalline silicon film PSF are set in such a manner that the embedded insulator ZOF is fully embedded into the deep trench DTC.

Thereby, the amount by which the TEOS oxide film SOF contracts when thermally oxidized is cancelled out by the amount by which the polycrystalline silicon film PSF expands and the amount by which the silicon thermal oxide film TSF grows toward the TEOS oxide film SOF when thermally oxidized. Consequently, it is possible to suppress the warpage of the semiconductor substrate SUB.

In particular, in the super-junction structure, a ratio of the occupation area of the embedded insulators ZOF to the area of the element region EFR is large in comparison with a corresponding ratio of the area of the element isolation region and is set to at least about 10%. Therefore, in a case where, for example, only the TEOS oxide film SOF is formed in the deep trench DTC which is formed in such a ratio as described above, when the TEOS oxide film SOF contracts, the semiconductor substrate SUB would warp with ease incidentally.

In the trench-filling technique used in the semiconductor device PSD according to the first embodiment, the amount by which the TEOS oxide film SOF thereof contracts when thermally oxidized is cancelled out by the amount by which the polycrystalline silicon film expands and the amount by which the silicon thermal oxide film TSF grows when thermally oxidized. Thereby, it is possible to surely suppress the warpage of the semiconductor substrate SUB.

On the other hand, in a case where the ratio of the occupation area of the embedded insulators ZOF to the area of the element region EFR is lower than about 10%, the possibility that the semiconductor substrate SUB may warp due to contraction of the TEOS oxide film SOF is reduced and therefore it is thought that necessity to form the polycrystalline silicon film PSF is reduced.

In addition, in the trench-filling technique according to the first embodiment, the TEOS oxide film SOF maintains a contraction state and the silicon oxide film POF maintains an expansion state after the thermal oxidation treatment is performed. That is, the TEOS oxide film SOF contracts irreversibly and the polycrystalline silicon film PSF (the silicon oxide film POF) expands irreversibly by being subjected to the thermal oxidation treatment. Thereby, it is possible to suppress the warpage of the semiconductor substrate SUB also after performing the thermal oxidation treatment.

Suppression of the warpage of the semiconductor substrate SUB makes it possible to suppress occurrence of a conveyance error in a semiconductor manufacturing device. In addition, suppression of the warpage makes it possible to surely suck the semiconductor substrate SUB onto a stage. Further, suppression of the warpage makes it possible to reduce the leakage current caused by the warpage of the semiconductor substrate SUB.

Incidentally, a state where the deep trench DTC is fully filled with no space in a state where the polycrystalline silicon film PSF is formed is illustrated in the process in FIG. 14. Alternatively, in a case where the embedded insulator ZOF enters a state of being fully embedded into the deep trench DTC after subjected to the thermal oxidation treatment, there may be space in the deep trench DTC in a state where the polycrystalline silicon film PSF is formed in the deep trench DTC.

In addition, the polycrystalline silicon film PSF is thermally oxidized by being subjected to the thermal oxidation treatment and thereby the silicon oxide film POF is formed. Therefore, the embedded insulator ZOF which is formed in the deep trench DTC is totally configured by insulating films (the silicon thermal oxide film TSF, the TEOS oxide film SOF and the silicon oxide film POF).

Figure 26:
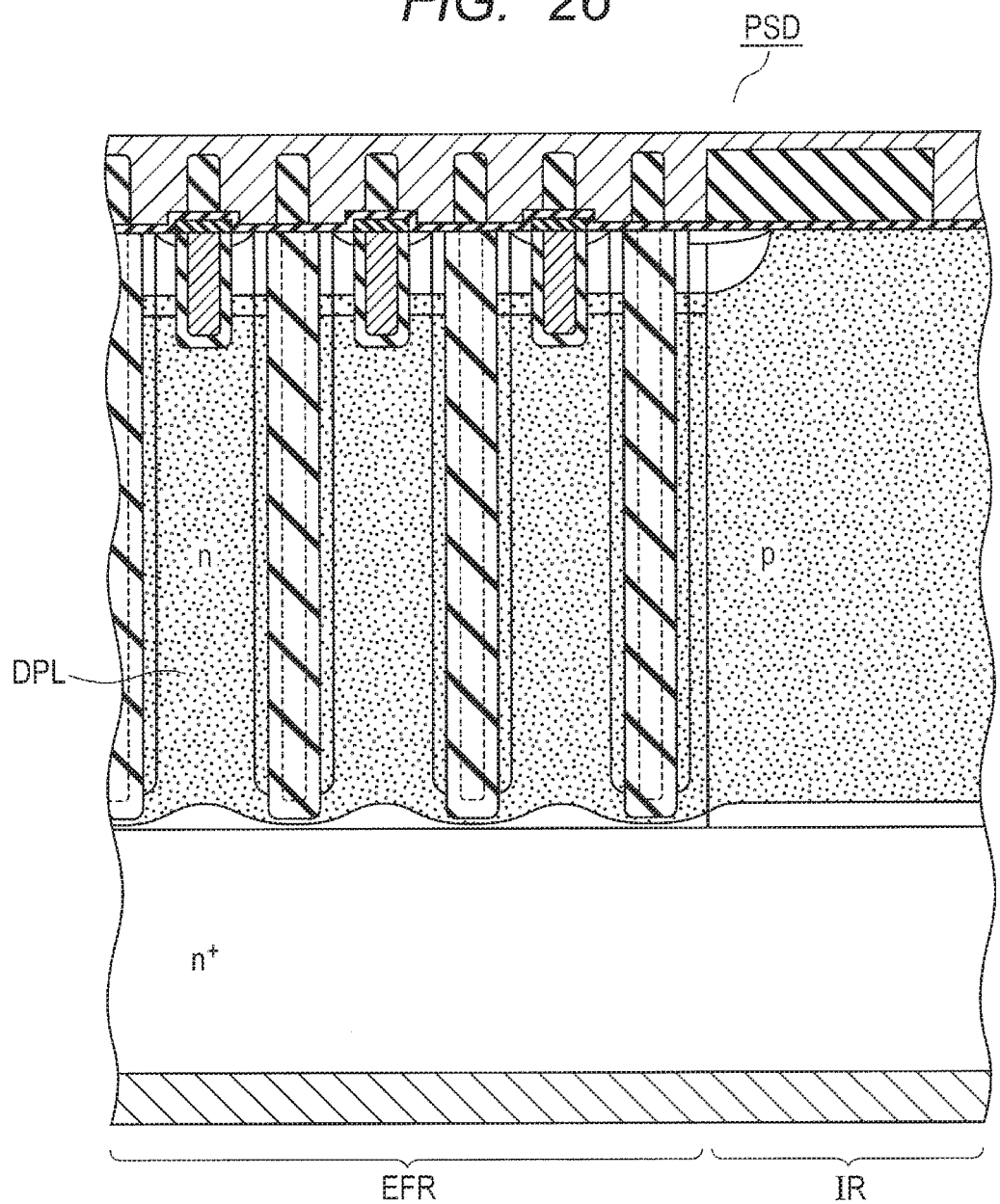
FIG. 26 is a sectional diagram illustrating one example of a depletion layer in the semiconductor device for explaining the operational advantages of the semiconductor device according to the first embodiment.

For this reason, the distribution of the depth-direction field intensity of the part such as the p-type column layer PCL and so forth located on each side of the deep trench DTC becomes uniform as the super-junction structure. Thereby, a depletion layer DPL surely extends and reaches a length which corresponds to a depth of the embedded insulator ZOF in an OFF-state of the semiconductor device PSD as illustrated in FIG. 26. Consequently, it is possible to stabilize the withstand voltage which is necessary for the semiconductor device PSD.

Modified Example

A case where the silicon nitride film NPG which covers the gate electrode TGEL is left unremoved is described in the item of the above-described semiconductor device PSD according to the first embodiment (see FIG. 2). The silicon nitride film NPG may be removed as necessary. Here, a case where the silicon nitride film NPG is removed in the middle of a manufacturing process will be described as the modified example. Incidentally, the same symbols are assigned to the members which are the same as the members which configure the semiconductor device PSD illustrated in FIG. 2 and so forth and description thereof will not be repeated unless otherwise deemed necessary.

Figure 27:
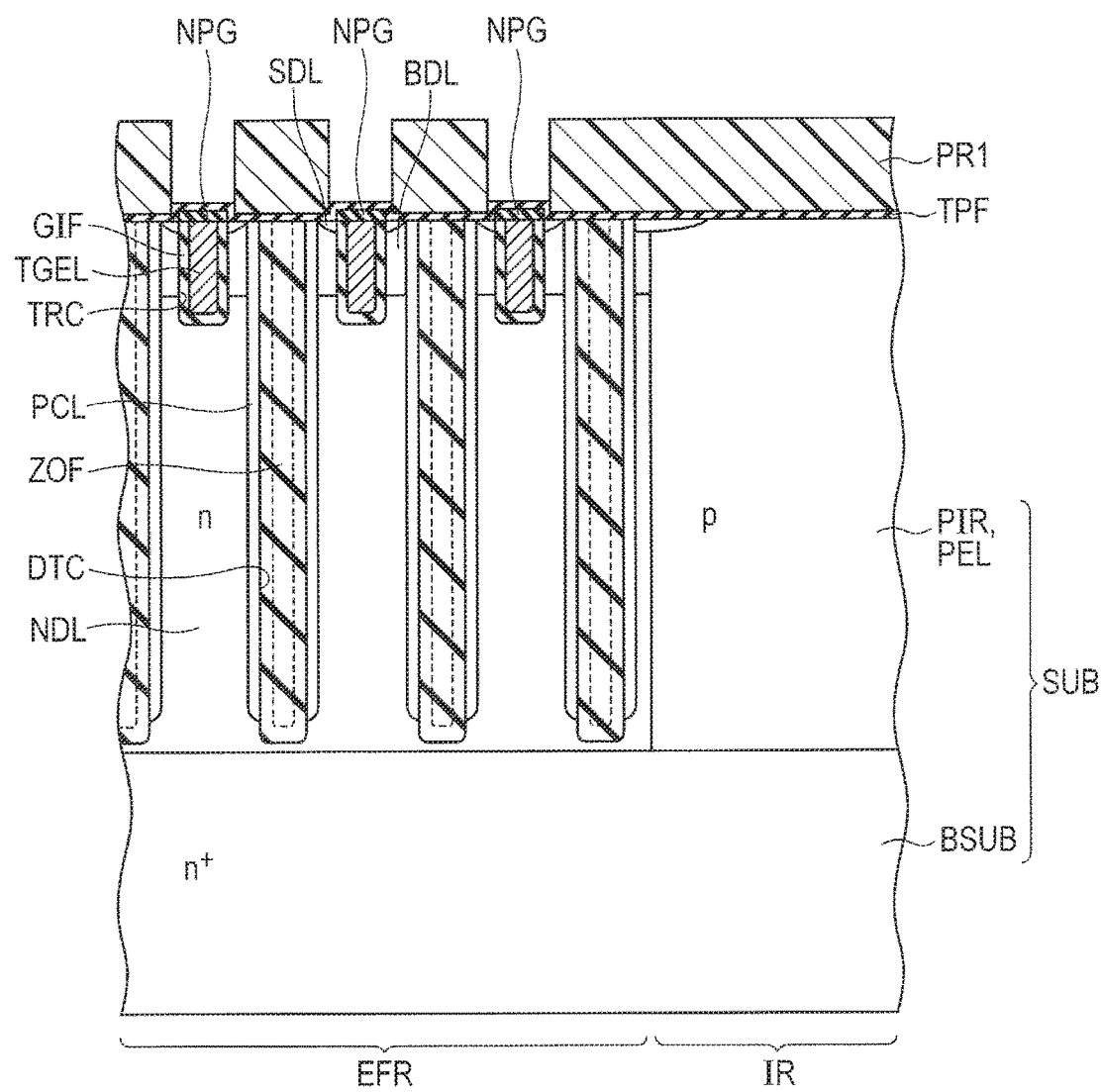
FIG. 27 is a sectional diagram illustrating one example of one process of a manufacturing method for a semiconductor device according to one modified example of the first embodiment.
Figure 28:
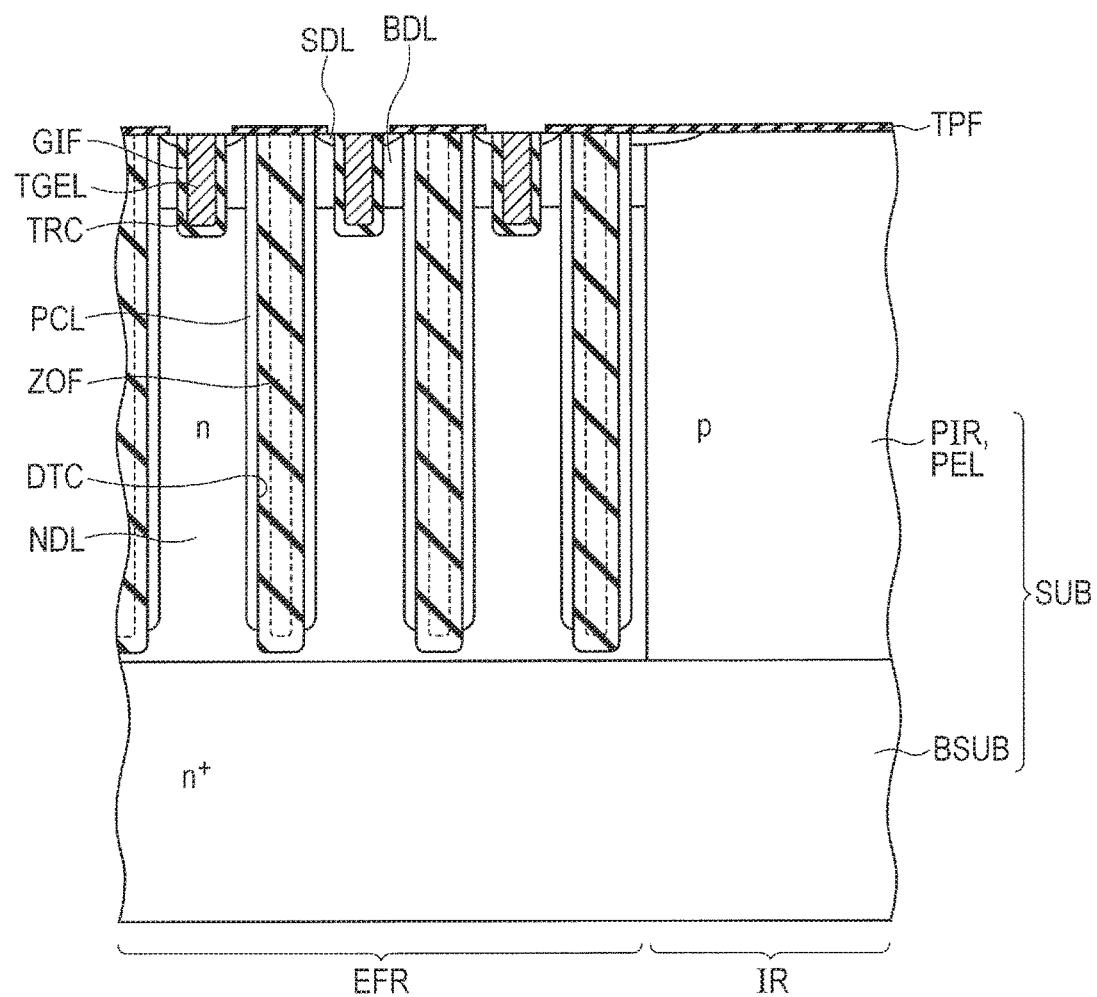
FIG. 28 is a sectional diagram illustrating one example of a process performed after performance of the process illustrated in FIG. 27 in the manufacturing method for the semiconductor device according to the modified example of the first embodiment.
Figure 29:
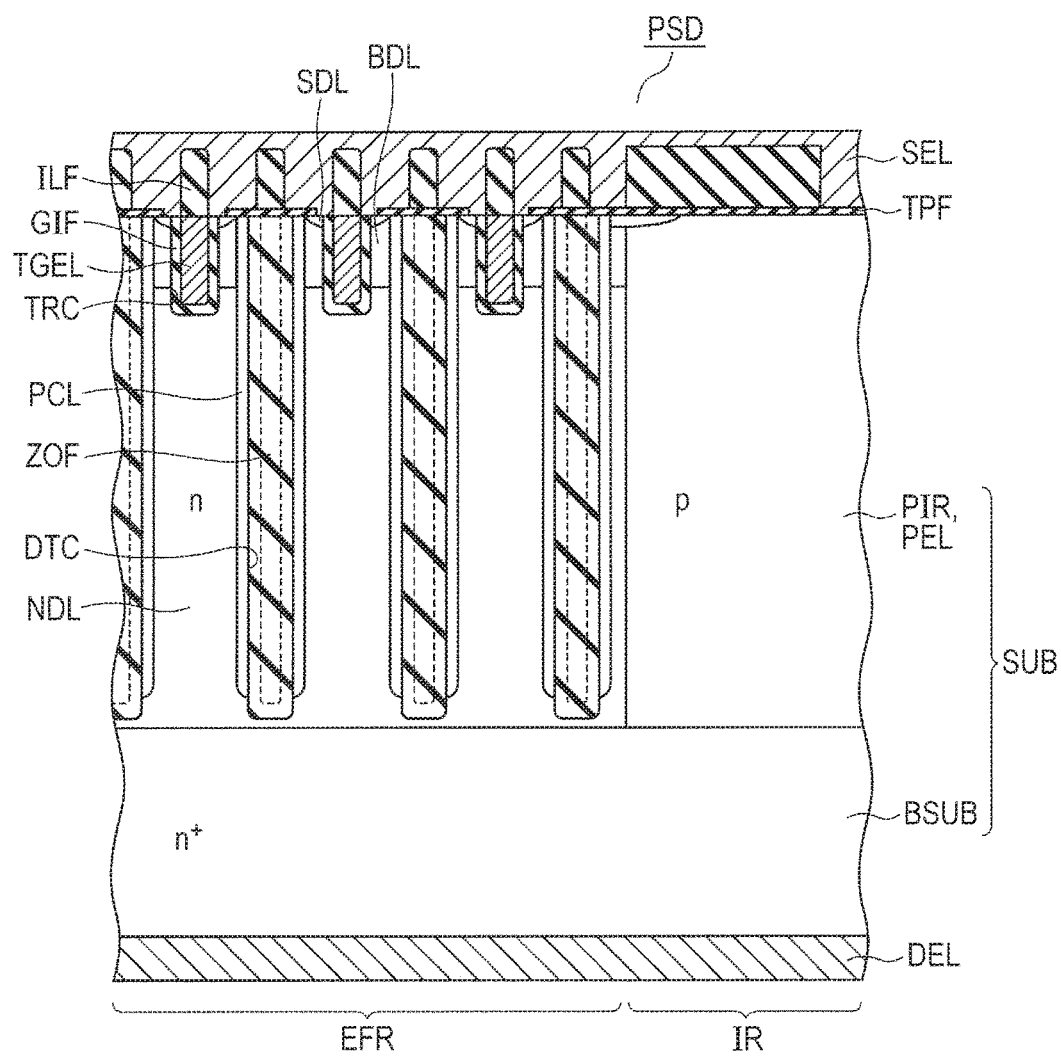
FIG. 29 is a sectional diagram illustrating one example of a process performed after performance of the process illustrated in FIG. 28 in the manufacturing method for the semiconductor device according to the modified example of the first embodiment.

After going through the processes illustrated in FIG. 8 to FIG. 20, the region where the silicon nitride film NPG is formed is exposed and a photoresist pattern PR1 which covers other regions is formed by performing, for example, the predetermined photoengraving treatment as illustrated in FIG. 27. Then, the silicon nitride film NPG is removed by performing, for example, the etching treatment by using the photoresist pattern PR1 as an etching mask. The gate electrode TGEL is exposed by removing the silicon nitride film NPG as illustrated in FIG. 28. Thereafter, formation of the main parts of the semiconductor device PSD is completed as illustrated in FIG. 29 after going through the process which is the same as the process illustrated in FIG. 21.

In the semiconductor device PSD according to the modified example, the silicon nitride film NPG which covers the gate electrode TGEL is simply removed after formation of the embedded insulator ZOF and the embedded insulator ZOF is not influenced by removal of the silicon nitride film NPG. Therefore, the effect of suppressing the warpage and so forth of the above-described semiconductor substrate SUB is not spoiled.

Second Embodiment

Figure 30:
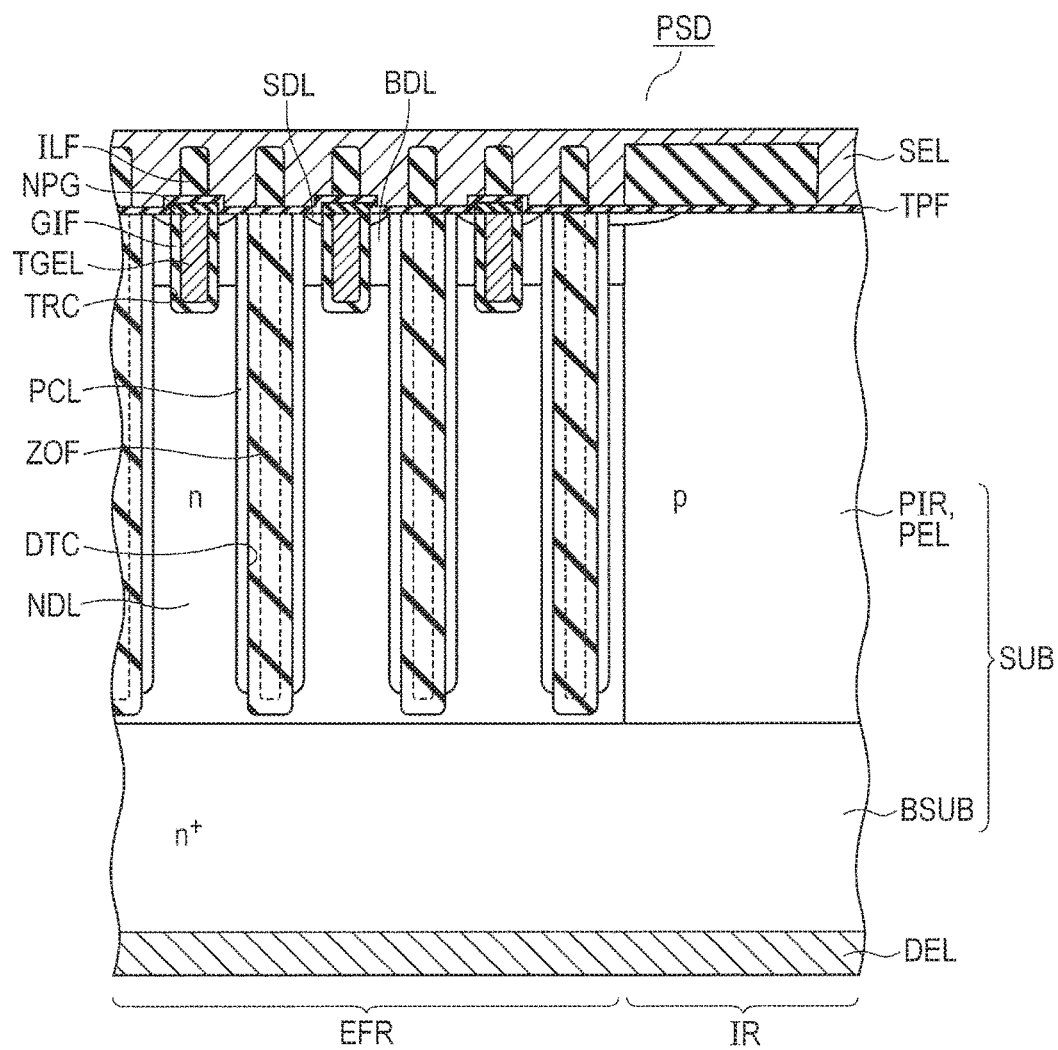
FIG. 30 is a sectional diagram illustrating one example of a semiconductor device according to a second embodiment.

A semiconductor device according to the second embodiment will be described. Each deep trench DTC which reaches the predetermined depth (the first depth) from the one principal surface (the first principal surface) of the semiconductor substrate SUB is formed in the n-type drift layer NDL in the element region EFR as illustrated in FIG. 30. The embedded insulator ZOF is formed in the deep trench DTC so formed. The embedded insulator ZOF is formed by performing the thermal oxidation treatment in a state where the silicon nitride film, the silicon oxide film and the polycrystalline silicon film (not illustrated) are formed in the deep trench DTC.

Figure 31:
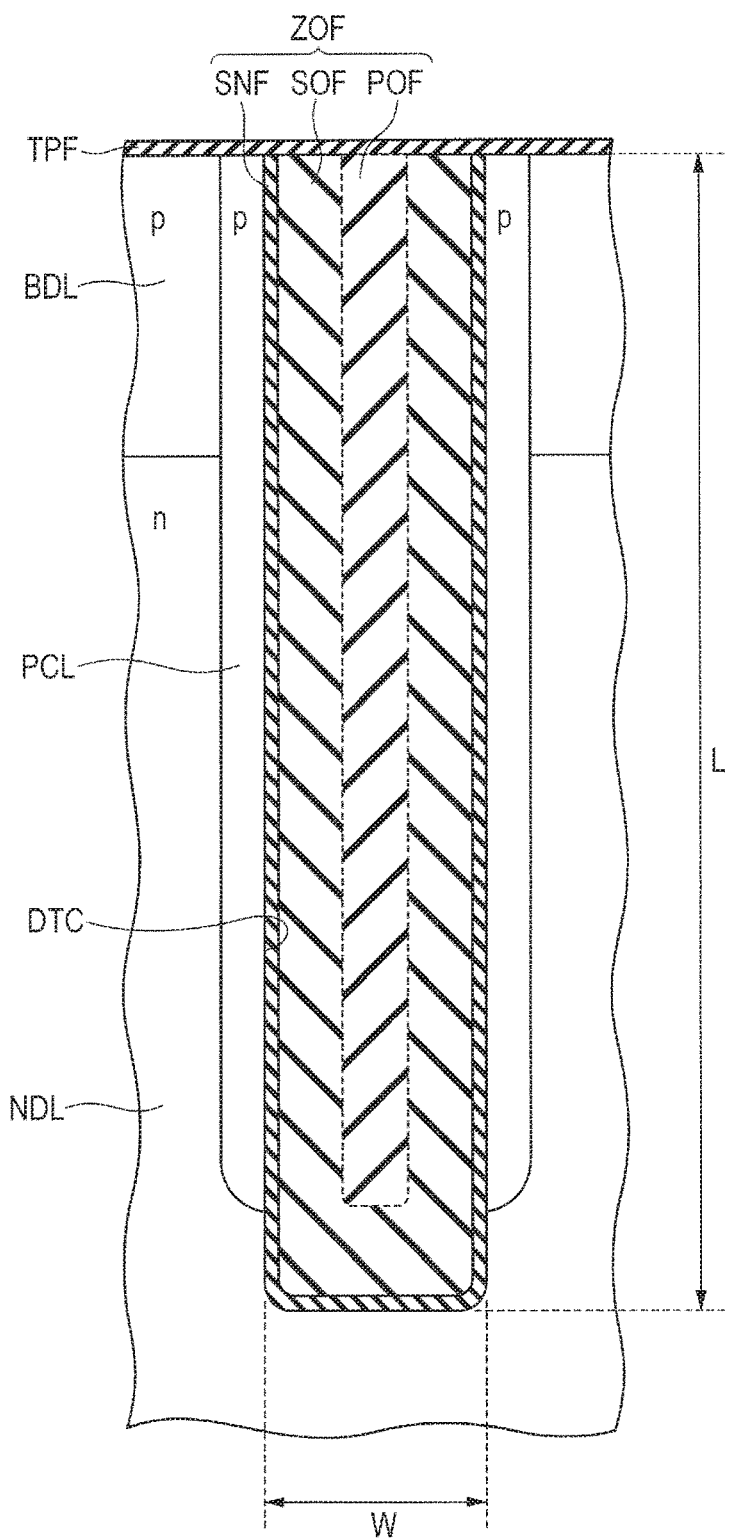
FIG. 31 is a partially enlarged sectional diagram illustrating one example of an embedded insulator formed in a deep trench of the semiconductor device according to the second embodiment.

The embedded insulator ZOF is configured by a silicon nitride film SNF, the TEOS oxide film SOF and the silicon oxide film POF as illustrated in FIG. 31. The silicon oxide film POF is a film which is formed by thermally oxidizing the polycrystalline silicon film formed in the deep trench DTC. The silicon nitride film SNF is a film which is formed in contact with the inner-wall surface of the deep trench DTC.

Incidentally, since the configurations of members other than the above are the same as the configurations of the members of the semiconductor device PSD illustrated in FIG. 2 and FIG. 3, the same symbols are assigned to the members which are the same as those of the semiconductor device PSD illustrated in FIG. 2 and FIG. 3 and description thereof will not be repeated unless otherwise deemed necessary.

Figure 32:
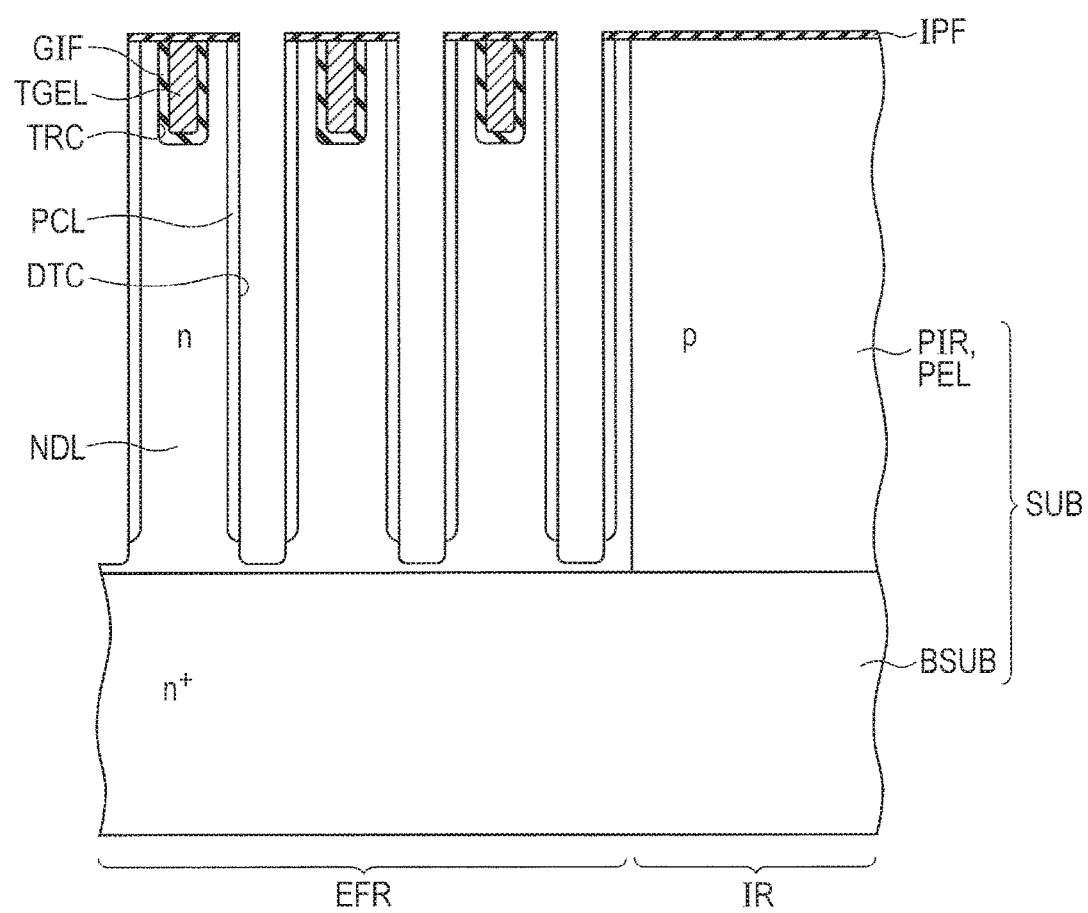
FIG. 32 is a sectional diagram illustrating one example of one process of a manufacturing method for the semiconductor device according to the second embodiment.

Then, one example of a manufacturing method for the above-described semiconductor device according to the second embodiment will be described. First, the p-type column layer PCL is formed along the sidewall surface of each deep trench DTC as illustrated in FIG. 32 by going through the processes which are the same as the processes illustrated in FIG. 8 to FIG. 11.

Figure 33:
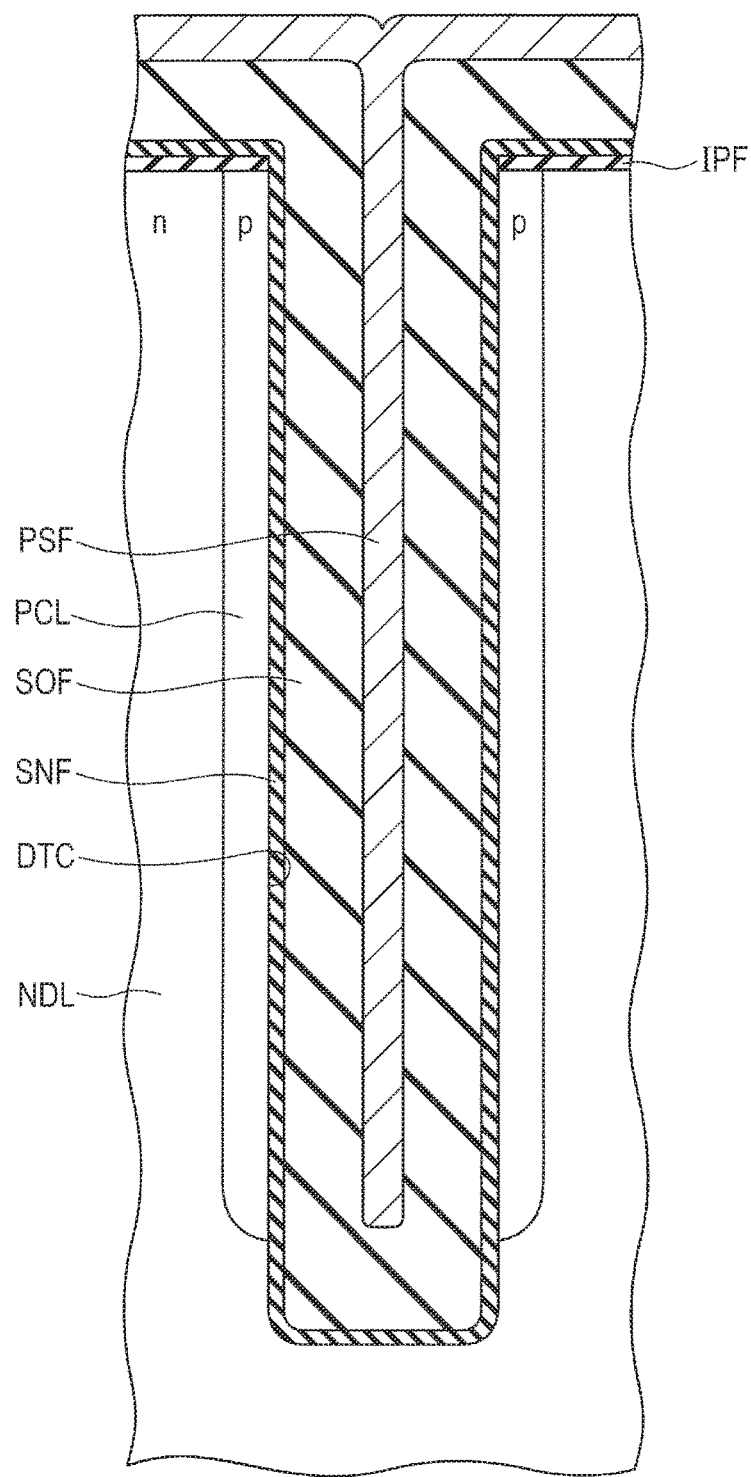
FIG. 33 is a partially enlarged sectional diagram illustrating one example of a process performed after performance of the process illustrated in FIG. 32 in the manufacturing method for the semiconductor device according to the second embodiment.

Then, the silicon nitride film SNF is formed by, for example, the CVD method (see FIG. 33). The silicon nitride film SNF is formed in contact with the inner-wall surface and so forth including the sidewall surface (the p-type column layer PCL) of the deep trench DTC. The silicon nitride film SNF has a function of blocking thermal oxidation. A film thickness of the silicon nitride film SNF is, for example, about 10 nm.

Then, the TEOS oxide film SOF is formed by, for example, the CVD method (see FIG. 33). The TEOS oxide film SOF is formed in contact with the silicon nitride film SNF. The TEOS oxide film SOF has the property that it contracts by being subjected to the thermal oxidation treatment as described above.

Then, the polycrystalline silicon film PSF is formed by, for example, the CVD method (see FIG. 33). The polycrystalline silicon film PSF is formed in contact with the TEOS oxide film SOF in a state of filling the deep trench DTC. The polycrystalline silicon film PSF has the property that it expands by being subjected to the thermal oxidation treatment as described above.

Figure 34:
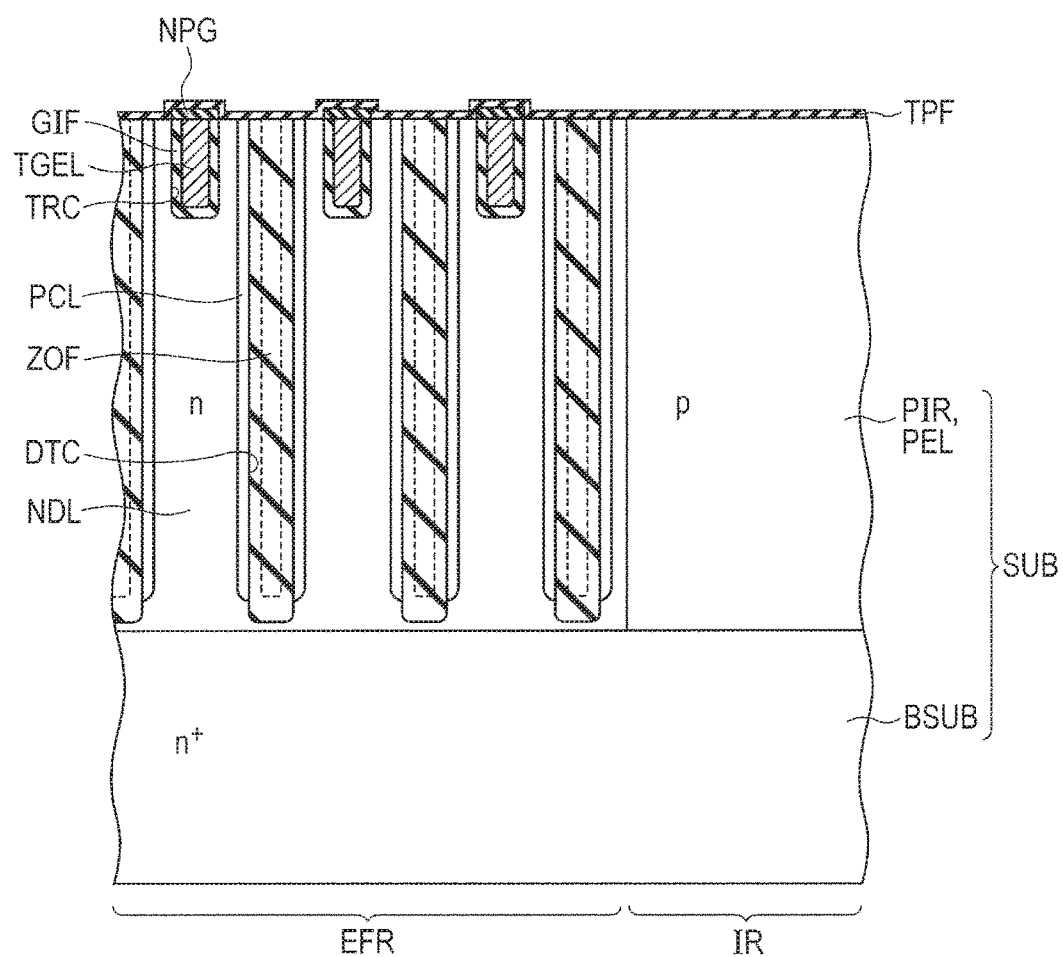
FIG. 34 is a sectional diagram illustrating one example of a process performed after performance of the process illustrated in FIG. 33 in the manufacturing method for the semiconductor device according to the second embodiment.

The silicon nitride film SNF, the TEOS oxide film SOF and the polycrystalline silicon film PSF are embedded into the deep trench DTC in this way as illustrated in FIG. 33. Then, after going through the processes which are the same as the processes illustrated in FIG. 15 to FIG. 17, the thermal oxidation treatment is performed, for example, in the wet atmosphere of the temperature of about 900° C. as illustrated in FIG. 34 and thereby the exposed front surface (the first principal surface) of the semiconductor substrate SUB (the n-type drift layer NDL and so forth) is thermally oxidized and the protective insulating film TPF is formed as illustrated in FIG. 34. The protective insulating film TPF has the function of suppressing the damage which would occur when performing the ion implantation as described above.

In this situation, in particular, the inner-wall surface including each sidewall surface (the p-type column layer PCL) of each deep trench DTC is covered with the silicon nitride film SNF in each deep trench DTC. Therefore, oxidation does not progress from parts such as the sidewall surface (the p-type column layer PCL) and so forth of the deep trench DTC by the thermal oxidation treatment.

Figure 35:
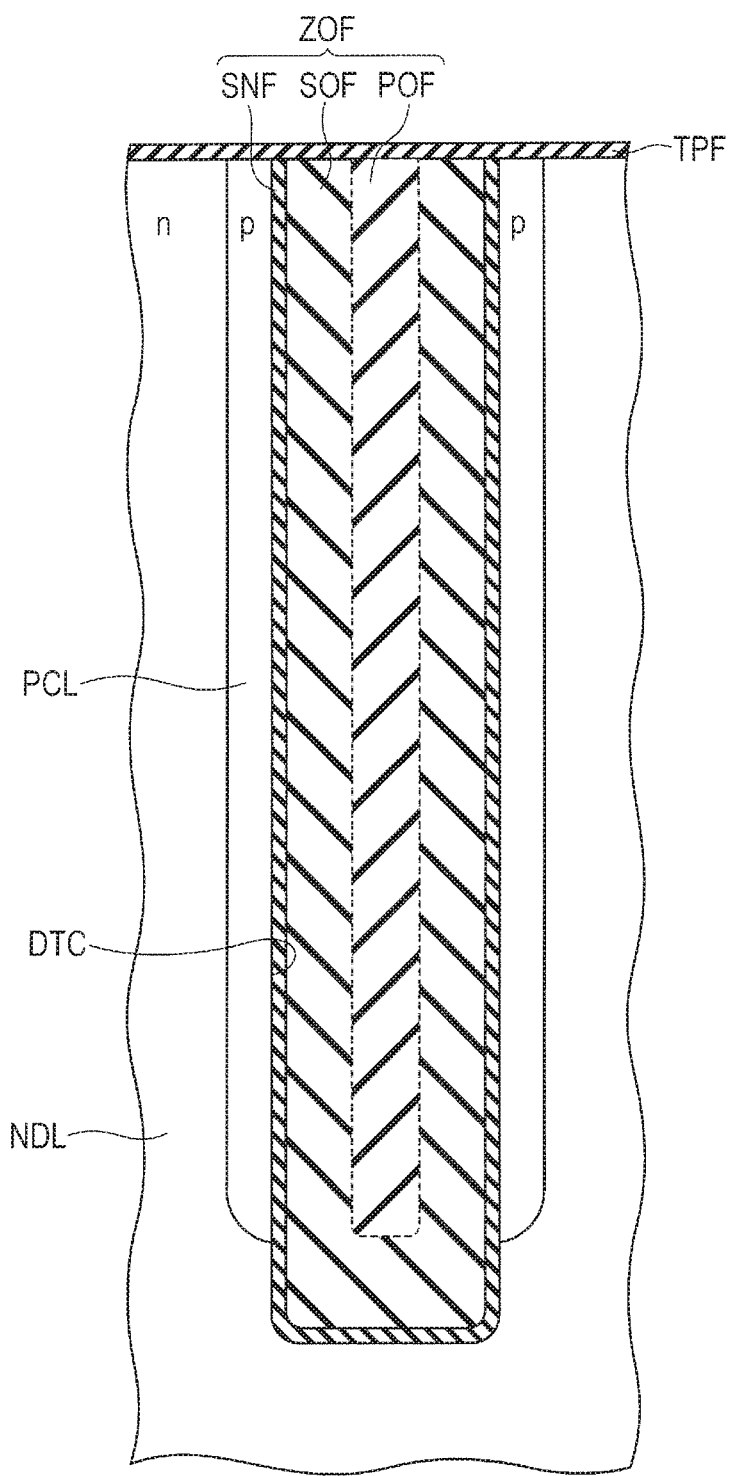
FIG. 35 is a partially enlarged sectional diagram illustrating one example of a structure in a deep trench in the process illustrated in FIG. 34 in the manufacturing method for the semiconductor device according to the second embodiment.

The TEOS oxide film SOF contracts by being subjected to the thermal oxidation treatment. The polycrystalline silicon film PSF is thermally oxidized and thereby the silicon oxide film POF is formed. The polycrystalline silicon film PSF expands when thermally oxidized. The embedded insulator ZOF is formed in the deep trench DTC in this way as illustrated in FIG. 35. Thereafter, formation of the main parts of the semiconductor substrate PSD is completed by going through the processes which are the same as the processes illustrated in FIG. 20 and FIG. 21 (see FIG. 30).

The silicon nitride film SNF is formed to cover the inner-wall surface of each deep trench DTC in the semiconductor device PSD according to the second embodiment. Therefore, when performing the thermal oxidation treatment (for example, at the temperature of about 900° C. and in the wet atmosphere) for formation of the protective insulating film TPF, it is possible to block thermal oxidation of the p-type column layer PCL (the semiconductor substrate SUB) which is located on the inner-wall surface of each deep trench DTC.

Thereby, formation of the thermal oxide film is impeded and thereby it is possible to suppress a reduction in impurity concentration (an amount of impurities) of the p-type column layer PCL. Since the reduction in impurity concentration (the amount of impurities) of the p-type column layer PCL is suppressed, it is possible to suppress a change in ratio of the impurity concentration of the p-type column layer PCL to the impurity concentration of the n-type drift layer NDL and hence to suppress a reduction in withstand voltage in the super-junction structure.

Figure 36:
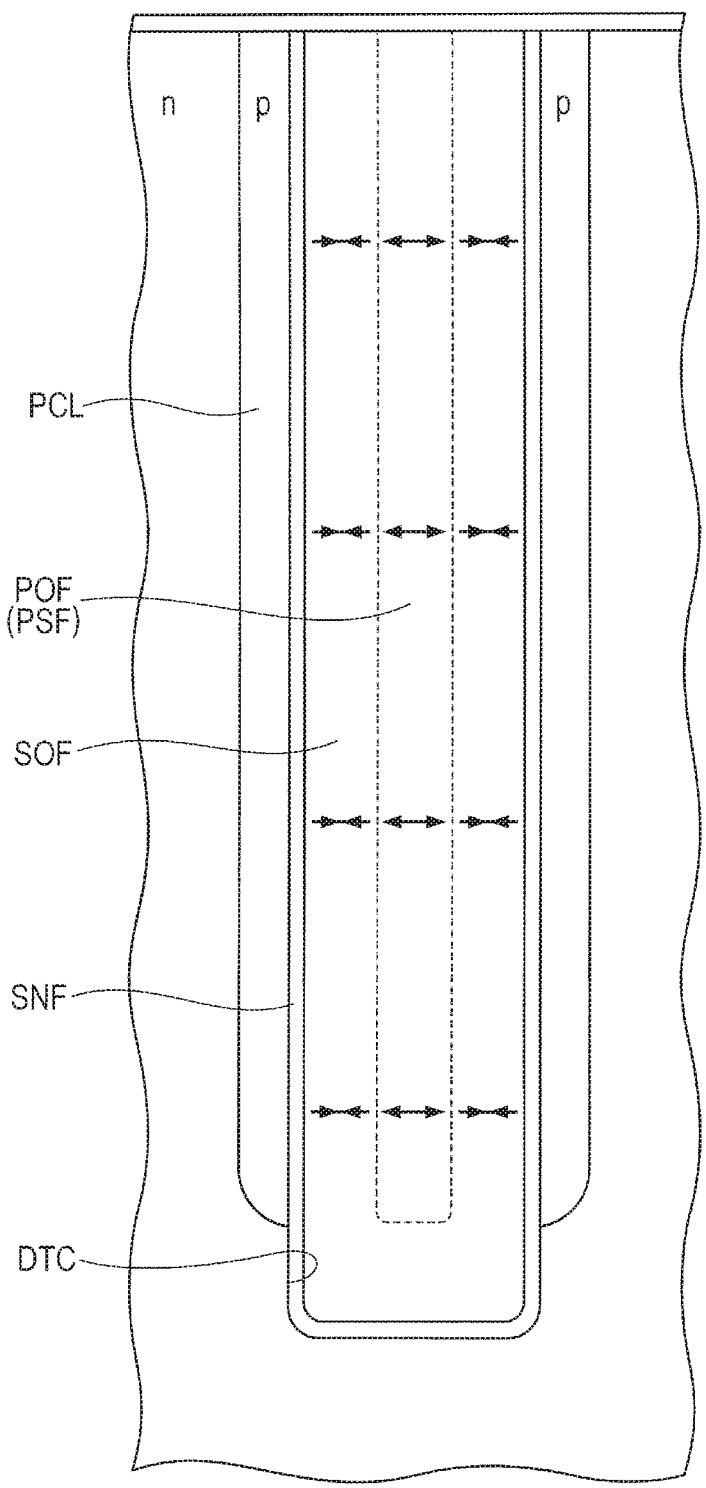
FIG. 36 is a partially enlarged sectional diagram schematically illustrating one example of the structure in the deep trench for explaining operational advantages of the semiconductor device according to the second embodiment.

Then, when performing the thermal oxidation treatment, the TEOS oxide film SOF contracts in the deep trench DTC as illustrated in FIG. 36 (see the inward arrows). The polycrystalline silicon film PSF is thermally oxidized and thereby the silicon oxide film POF is formed. The polycrystalline silicon film PSF expands (see the outward arrows) when thermally oxidized.

Here, the amount by which the polycrystalline silicon film PSF expands and the amount by which the TEOS oxide film SOF contracts when thermally oxidized are taken into consideration for the width of the deep trench DTC and thereby the film thickness of the silicon nitride film SNF, the film thickness of the TEOS oxide film SOF and the film thickness of the polycrystalline silicon film PSF are set in such a manner that the embedded insulator ZOF is fully embedded into the deep trench DTC after performing the thermal oxidation treatment.

Thereby, the amount by which the TEOS oxide film SOF contracts when thermally oxidized is cancelled out by the amount by which the polycrystalline silicon film PSF expands when thermally oxidized similarly to the semiconductor device PSD according to the first embodiment. Consequently, it is possible to suppress the warpage of the semiconductor substrate SUB without reducing the impurity concentration (the amount of impurities) of the p-type column layer PCL. That is, it is possible to suppress the warpage of the semiconductor substrate SUB without inducing the reduction in withstand voltage caused by the change in ratio of the impurity concentration of the p-type column layer PCL to the impurity concentration of the n-type drift layer NDL in the super-junction structure.

In addition, the TEOS oxide film SOF irreversibly contracts and the polycrystalline silicon film PSF (the silicon oxide film POF) irreversibly expands by being subjected to the thermal oxidation treatment as described above. Thereby, it is possible to suppress the warpage of the semiconductor substrate SUB also after performing the thermal oxidation treatment.

The semiconductor device PSD according to the second embodiment is suitable for a case where the impurity concentration of the p-type column layer PCL is set to a comparatively low value. That is, the configuration of the semiconductor device PSD according to the second embodiment exhibits its effects in a semiconductor device which is comparatively high in drain withstand voltage and is comparatively long in length of the embedded insulator ZOF (the depth of the deep trench DTC). More specifically, the configuration of the semiconductor device according to the second embodiment is suitable for a semiconductor device that, for example, the length of the embedded insulator ZOF (the depth of the deep trench DTC) is at least about 6 μm, the trench width is at least about 0.7 μm and the drain withstand voltage is at least about 80 V.

Since the deeper the depth of the deep trench DTC becomes, the more embedding of the silicon nitride film SNF, the TEOS oxide film SOF and the polycrystalline silicon film PSF into the deep trench DTC becomes difficult, it is necessary to increase the width of the deep trench DTC incidentally. It is preferable that the aspect ratio (the depth L/the width W, see FIG. 31) of the deep trench DTC be at least about 7.

Third Embodiment

Figure 37:
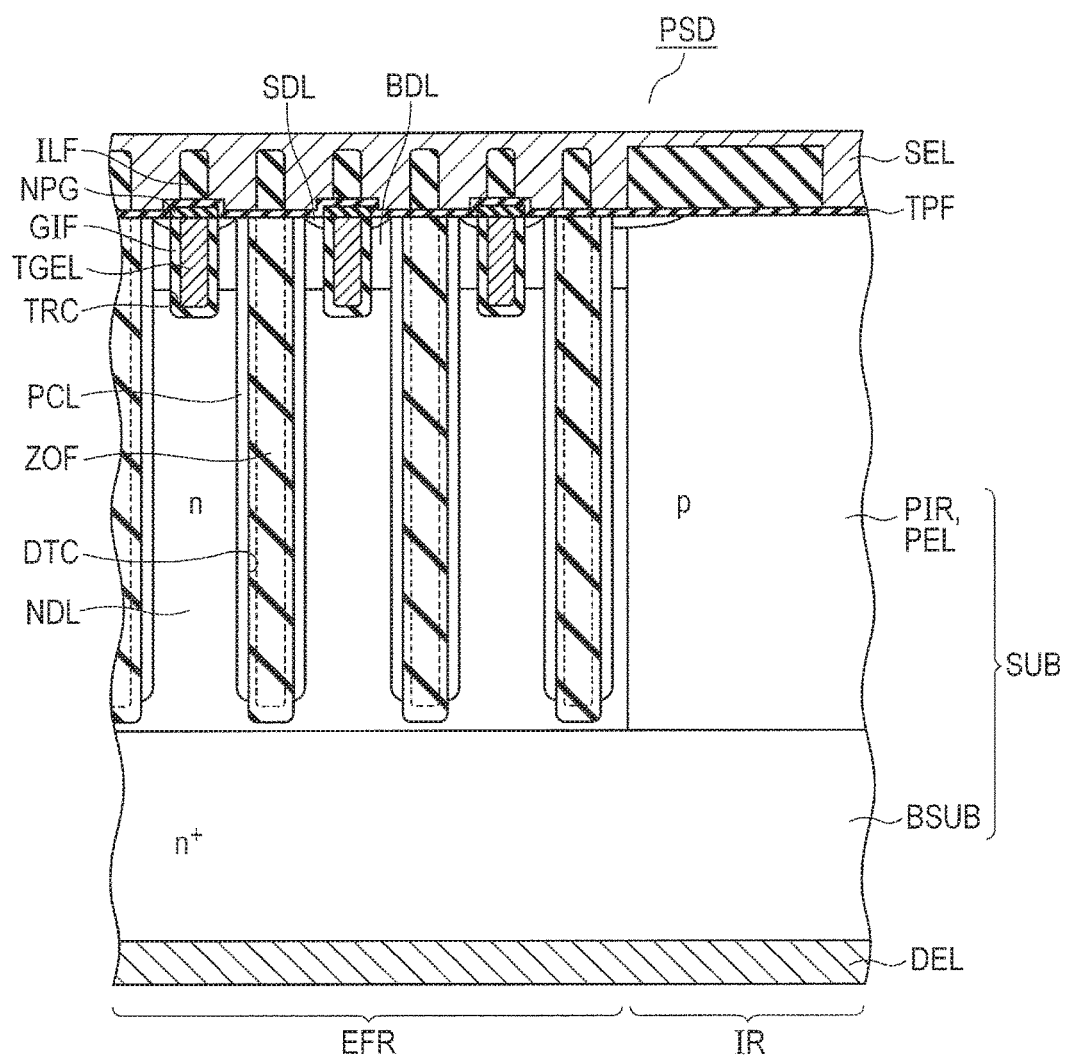
FIG. 37 is a sectional diagram illustrating one example of a semiconductor device according to a third embodiment.

A semiconductor device according to the third embodiment will be described. The deep trenches DTC which reach the predetermined depth (the first depth) from one principal surface (the first principal surface) of the semiconductor substrate SUB are formed in the n-type drift layer NDL in the element region EFR as illustrated in FIG. 37. The embedded insulator ZOF is formed in each of the deep trenches DTC. The embedded insulator ZOF is formed by performing the thermal oxidation treatment in a state where the silicon nitride film, the silicon oxide film and the polycrystalline silicon film (not illustrated) are formed in the deep trench DTC.

Figure 38:
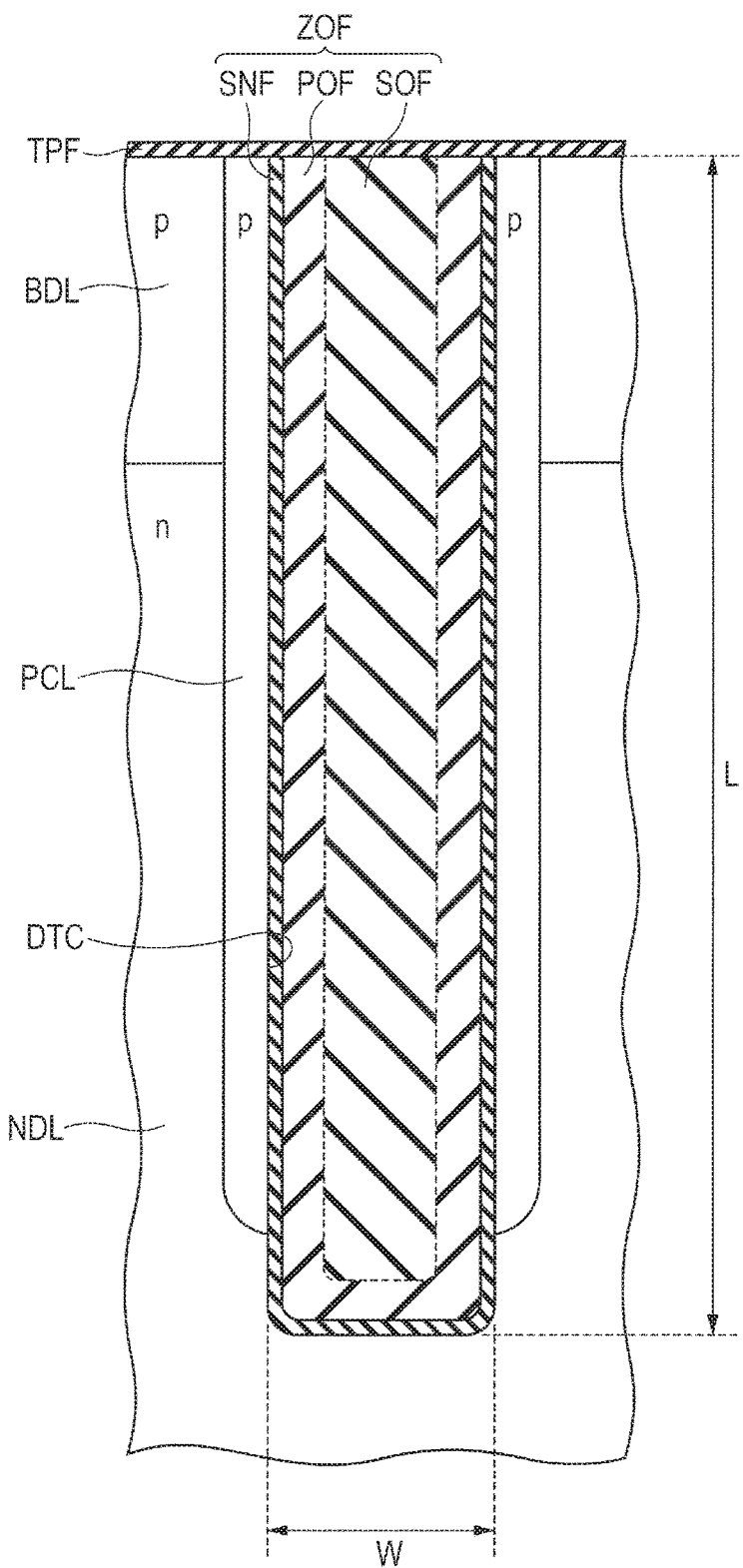
FIG. 38 is a partially enlarged sectional diagram illustrating one example of an embedded insulator formed in the deep trench of the semiconductor device according to the third embodiment.

The embedded insulator ZOF is configured by the silicon nitride film SNF, the silicon oxide film POF and the TEOS oxide film SOF as illustrated in FIG. 38. The silicon oxide film POF is the film which is formed by thermally oxidizing the polycrystalline silicon film formed in the deep trench DTC. The silicon nitride film SNF is the film which is formed in contact with the inner-wall surface of the deep trench DTC.

Incidentally, since the configurations of members other than the above are the same as the configurations of the members of the semiconductor device PSD illustrated in FIG. 2 and FIG. 3, the same symbols are assigned to the members which are the same as those of the semiconductor device PSD illustrated in FIG. 2 and FIG. 3 and description thereof will not be repeated unless otherwise deemed necessary.

Figure 39:
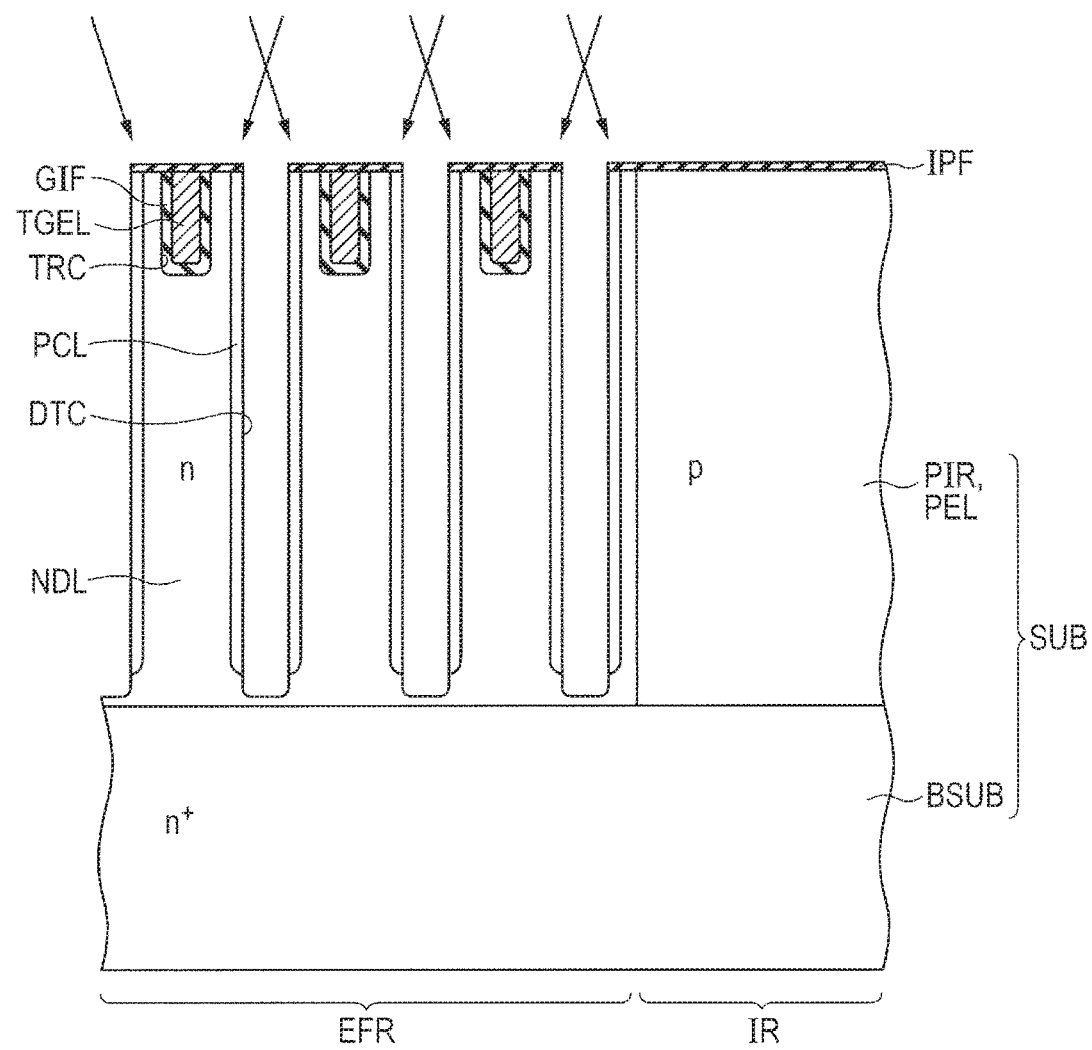
FIG. 39 is a sectional diagram illustrating one example of one process of a manufacturing method for the semiconductor device according to the third embodiment.

Then, one example of the manufacturing method for the semiconductor device according to the third embodiment will be described. First, the p-type column layer PCL is formed along each sidewall surface of each deep trench DTC as illustrated in FIG. 39 by going through the processes which are the same as the processes illustrated in FIG. 8 to FIG. 11.

Figure 40:
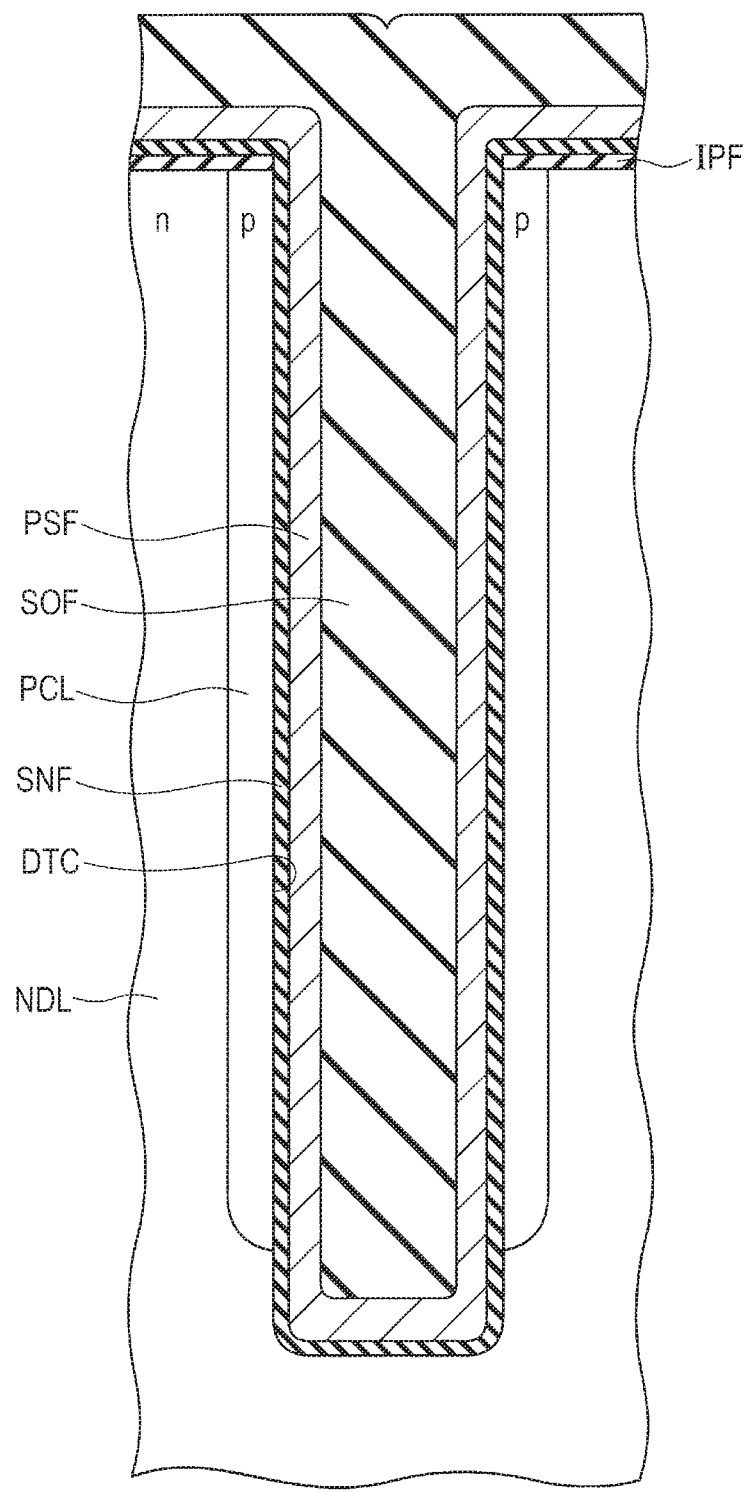
FIG. 40 is a partially enlarged sectional diagram illustrating one example of a process performed after performance of the process illustrated in FIG. 39 in the manufacturing method for the semiconductor device according to the third embodiment.

Then, the silicon nitride film SNF (about 10 nm in film thickness) which has the function of blocking thermal oxidation is formed by, for example, the CVD method (see FIG. 40). The silicon nitride film SNF is formed in contact with the inner-wall surface including the sidewall surface (the p-type column layer PCL) of the deep trench DTC.

Then, the polycrystalline silicon film PSF is formed by, for example, the CVD method (see FIG. 40). The polycrystalline silicon film PSF is formed in contact with the silicon nitride film SNF. The polycrystalline silicon film PSF has the property that it expands by being subjected to the thermal oxidation treatment as described above.

Then, the TEOS oxide film SOF is formed by, for example, the CVD method (see FIG. 40). The TEOS oxide film SOF is formed in contact with the silicon nitride film SNF in a state of filling the deep trench DTC. The TEOS oxide film SOF has the property that it contracts by being subjected to the thermal oxidation treatment as described above.

Figure 41:
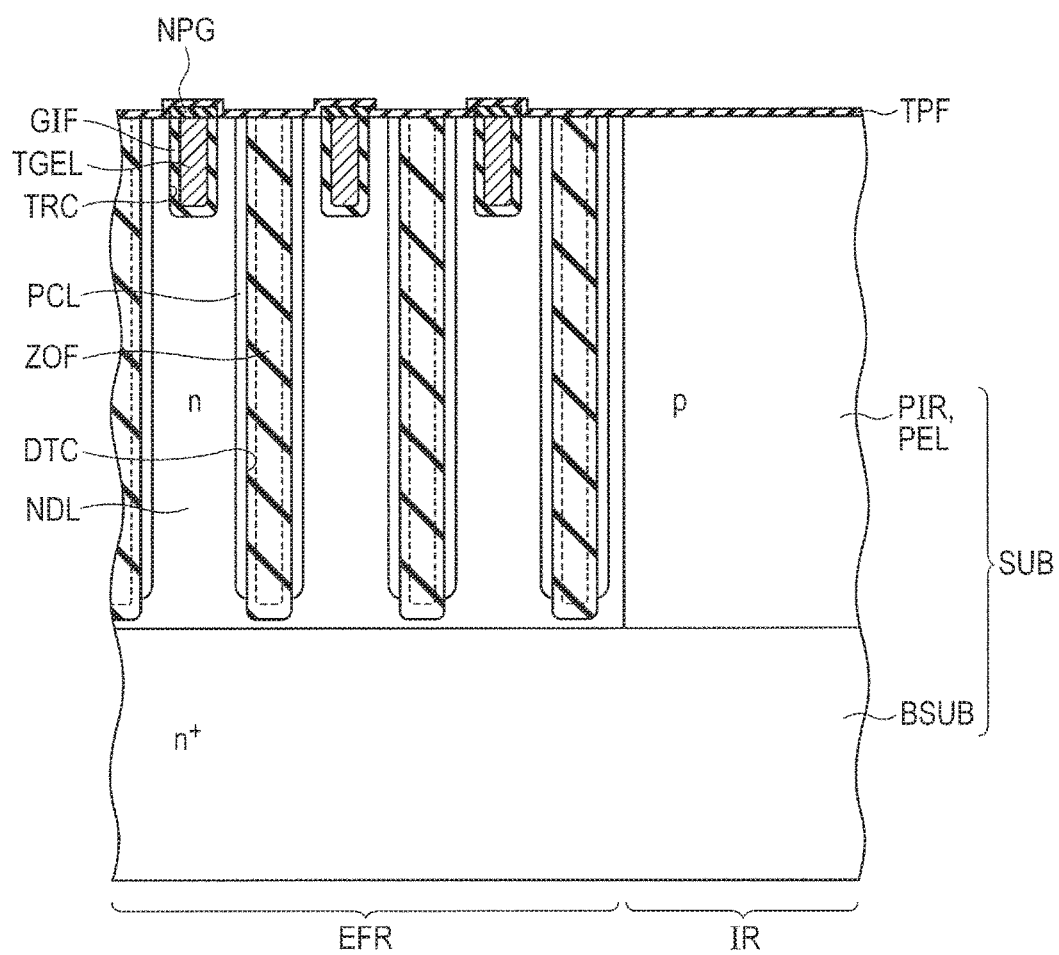
FIG. 41 is a sectional diagram illustrating one example of a process performed after performance of the process illustrated in FIG. 40 in the manufacturing method for the semiconductor device according to the third embodiment.

The silicon nitride film SNF, the polycrystalline silicon film PSF and the TEOS oxide film SOF are embedded into the deep trench DTC in this way as illustrated in FIG. 40. Then, after going through the processes which are the same as the processes illustrated in FIG. 1 to FIG. 17, the thermal oxidation treatment is performed in, for example, the wet atmosphere of the temperature of about 900° C. and thereby the exposed front surface (the first principal surface) of the semiconductor substrate SUB (the n-type drift layer NDL and so forth) is thermally oxidized and the protective insulating film TPF is formed as illustrated in FIG. 41. The protective insulating film TPF has the function of suppressing the damage which would occur when performing ion implantation as described above.

In this situation, in particular, the sidewall surface (the p-type column layer PCL) and so forth of each deep trench DTC are covered with the silicon nitride film SNF in the deep trench DTC. Therefore, oxidation does not progress from parts such as the sidewall surface (the p-type column layer PCL) and so forth of the deep trench DTC by the thermal oxidation treatment.

Figure 42:
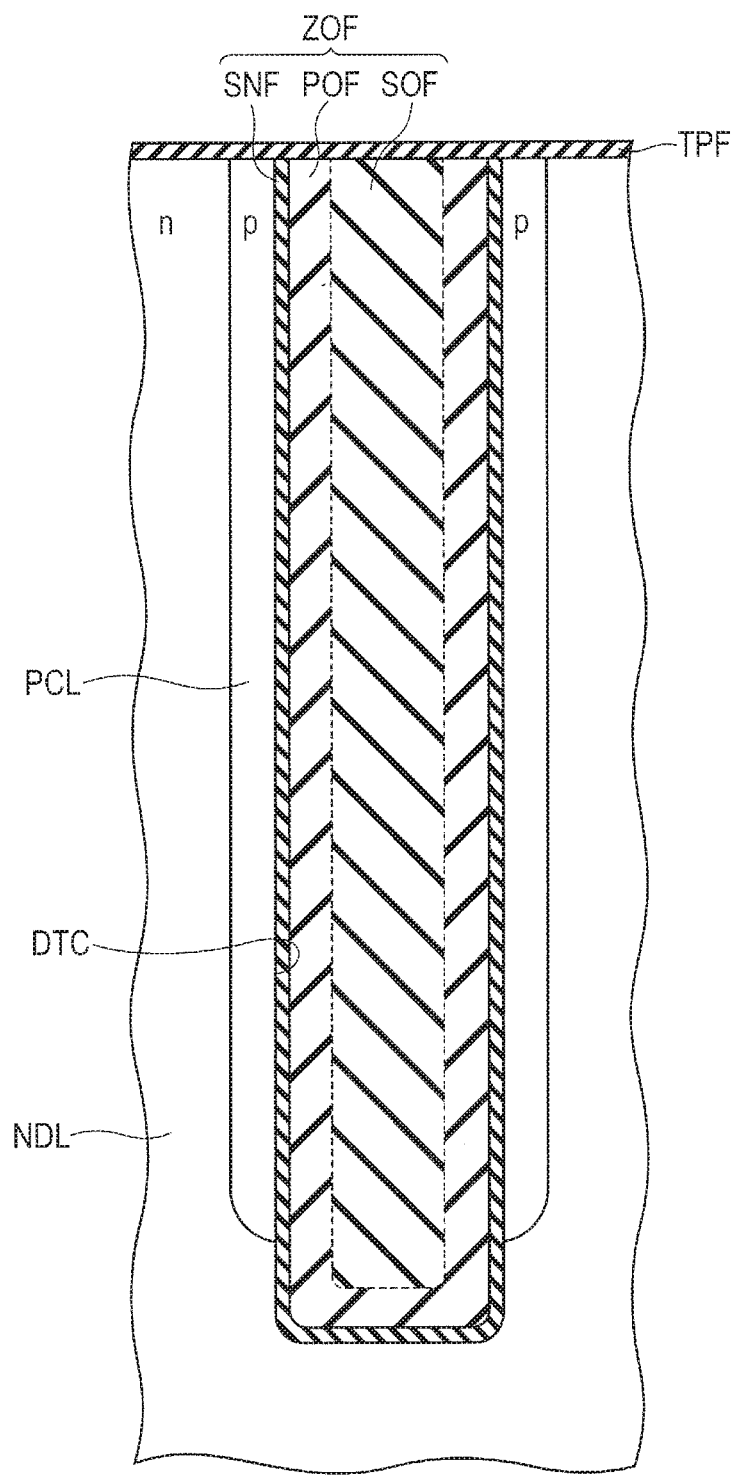
FIG. 42 is a partially enlarged sectional diagram illustrating one example of a structure in a deep trench in the process illustrated in FIG. 41 in the manufacturing method for the semiconductor device according to the third embodiment.

The TEOS oxide film SOF contracts by being subjected to the thermal oxidation treatment. The polycrystalline silicon film PSF is thermally oxidized and thereby the silicon oxide film POF is formed. The polycrystalline silicon film PSF expands when thermally oxidized. The embedded insulator ZOF is formed in the deep trench DTC in this way as illustrated in FIG. 42. Thereafter, formation of the main parts of the semiconductor substrate PSD is completed by going through the processes which are the same as the processes illustrated in FIG. 20 and FIG. 21 (see FIG. 37).

The silicon nitride film SNF is formed to cover the inner-wall surface of each deep trench DTC in the semiconductor device PSD according to the third embodiment. Therefore, in a case of performing the thermal oxidation treatment (for example, at the temperature of about 900° C. and in the wet atmosphere) for formation of the protective insulating film TPF, it is possible to block thermal oxidation of the p-type column layer PCL (the semiconductor substrate SUB) which is located on the inner-wall surface of each deep trench DTC.

Thereby, formation of the thermal oxide film is impeded and therefore it is possible to suppress the reduction in impurity concentration (the amount of impurities) of the p-type column layer PCL. Since the reduction in impurity concentration (the amount of impurities) of the p-type column film PCL is suppressed in this way, it is possible to suppress the change in ratio of the impurity concentration of the p-type column layer PCL to the impurity concentration of the n-type drift layer NDL and hence to suppress the reduction in withstand voltage in the super-junction structure.

Figure 43:
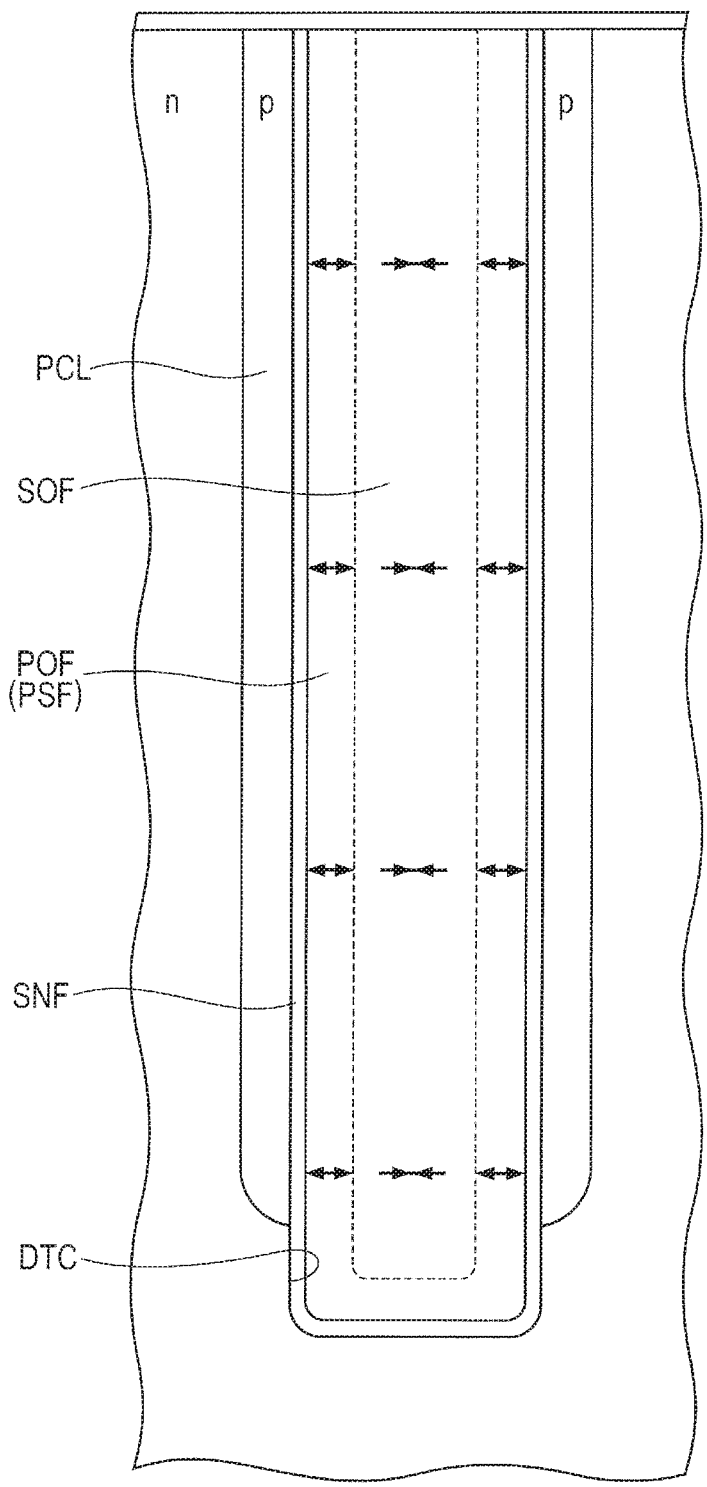
FIG. 43 is a partially enlarged sectional diagram schematically illustrating one example of the structure in the deep trench for explaining operational advantages of the semiconductor device according to the third embodiment.

Then, when performing the thermal oxidation treatment, the polycrystalline silicon film PSF is thermally oxidized and thereby the silicon oxide film POF is formed in the deep trench DTC as illustrated in FIG. 43. The polycrystalline silicon film PSF expands (see the outward arrows) and the TEOS oxide film SOF contracts (see the inward arrow) when thermally oxidized.

The amount by which the polycrystalline silicon film PSF expands and the amount by which the TEOS oxide film SOF contracts when thermally oxidized are taken into consideration for the width of the deep trench DTC and thereby the film thickness of the silicon nitride film SNF, the film thickness of the TEOS oxide film SOF and the film thickness of the polycrystalline silicon film PSF are set in such a manner that the embedded insulator ZOF is fully embedded into the deep trench DTC after performing the thermal oxidation treatment.

Thereby, the amount by which the TEOS oxide film SOF contracts is cancelled out by the amount by which the polycrystalline silicon film PSF expands when thermally oxidized similarly to the semiconductor device PSD according to the second embodiment. Consequently, it is possible to suppress the warpage of the semiconductor substrate SUB without inducing the reduction in withstand voltage caused by the change in ratio of the impurity concentration of the p-type column layer PCL to the impurity concentration of the n-type drift layer NDL in the super-junction structure as described in the column of the second embodiment.

In addition, the TEOS oxide film SOF irreversibly contracts and the polycrystalline silicon film PSF (the silicon oxide film POF) irreversibly expands by being subjected to the thermal oxidation treatment as described above.

Thereby, it is possible to suppress the warpage of the semiconductor substrate SUB also after performing the thermal oxidation treatment.

The configuration of the semiconductor device PSD according to the third embodiment is applicable to a semiconductor device that, for example, the length of the embedded insulator ZOF (the depth of the deep trench DTC) is at least about 6 μm, the trench width is at least about 0.7 μm, the aspect ratio (the depth L/the width W see FIG. 31) is at least about 7 and the drain withstand voltage is at least about 80 V similarly to the case of the semiconductor device PSD described in the column of the second embodiment.

In addition, there are cases where the semiconductor device PSD according to the third embodiment is also applicable to a case where the width of the embedded insulator ZOF (the width of the deep trench DTC) is narrower than about 0.7 μm and the length of the embedded insulator ZOF (the depth of the deep trench) is shorter than about 6 μm.

It is necessary to set the ratio of the film thickness of the TEOS oxide film SOF to the film thickness of the polycrystalline silicon film PSF to a certain value in order to fully negate the stress caused by the embedded insulator ZOF. In a case where the width of the deep trench DTC is narrower than about 0.7 μm, the film thickness of the TEOS oxide film SOF is thinned incidentally. Therefore, it is necessary to very thin also the film thickness of the polycrystalline silicon film PSF in accordance with the film thickness of the TEOS oxide film SOF.

Here, it is supposed that, for example, a percentage of volumetric contraction (a percentage of film contraction) of the TEOS oxide film SOF is about 3% and an increment in film thickness pertaining to thermal oxidation of the polycrystalline silicon film PSF is about two times the original film thickness. In this case, it would be necessary to set the ratio of the film thickness of the TEOS oxide film SOF to the film thickness of the polycrystalline silicon film PSF to about 1:0.03.

A case where the width of the deep trench DTC is, for example, about 0.3 μm is supposed. In this case, when it is attempted to form the TEOS oxide film first and to form the polycrystalline silicon film PSF then, a width of an opening used for formation of the polycrystalline silicon film PSF is vary narrowed to not more than about 9 nm. Therefore, there is a possibility that it may be impossible to form the polycrystalline silicon film PSF in the deep trench DTC.

In the above-described technique according to the third embodiment, the polycrystalline silicon film PSF is formed first and the TEOS oxide film SOF is formed then. Thereby, the opening which is wide enough for formation of the polycrystalline silicon film PSF is secured and it becomes possible to surely form the polycrystalline silicon film PSF in the deep trench DTC.

Incidentally, the above-mentioned semiconductor devices according to the first to third embodiments are described by giving the MOSFET as one example of the semiconductor element. However, the semiconductor element to be used will not be limited to the MOSFET as long as it is a semiconductor element which performs current conduction between one principal surface and the other principal surface of the semiconductor substrate and, for example, a p-n diode, a Schottky diode, an IGBT (Insulated Gate Bipolar Transistor) and so forth may be used. In addition, the polycrystalline silicon film is given as one example of the film which expands by being subjected to the thermal oxidation treatment. However, the film to be used may not be limited to the polycrystalline silicon film as long as it is a film which expands by being subjected to the thermal oxidation treatment and is finally insulated. Further, the silicon nitride film is given as one example of the film which blocks thermal oxidation. However, the film to be used may not be limited to the silicon nitride film as long as it is a film which is able to block the thermal oxidation.

It is possible to combine the semiconductor devices which are described in the items of the respective embodiments with one another in a variety of ways as necessary. For example, the modified example described in the item of the first embodiment may be applied to the first and second embodiments.

Although the invention which is made by the inventors of the present invention is described on the basis of the respective embodiments, it goes without saying that the present invention is not limited to the above-described embodiments and may be modified and altered in a variety of ways within the range not deviating from the gist of the present invention.

What is claimed is:

1. A manufacturing method for a semiconductor device which includes a semiconductor element in which a first conductivity type first region and a second conductivity type second region which is formed in contact with the first conductivity type first region are alternately arranged and which performs electric current conduction between a first principal surface and a second principal surface of a semiconductor substrate, comprising the steps of:
   (a) forming the semiconductor element;
   (b) defining an element region on the first principal surface side of the semiconductor substrate;
   (c) forming a trench which reaches a first depth from the first principal surface of the semiconductor substrate in the element region;
   (d) introducing a first conductivity type first impurity through the trench and thereby forming the first conductivity type first region down to a second depth which is deeper than the first depth from the first principal surface of the semiconductor substrate;
   (e) introducing a second conductivity type second impurity through the trench and thereby forming the second conductivity type second region in contact with the first conductivity type first region along sidewall surfaces of the trench; and
   (f) forming an embedding element which includes a first film and a second film to fill the trench with the embedding element,
   wherein the step (a) of forming the semiconductor element includes the step (g) of forming a protective insulating film over the first principal surface of the semiconductor substrate which is located in the element region by thermal oxidation,
   wherein in the step (g) of forming the protective insulating film, the first film contracts, the second film expands and the embedding element turns into an embedded insulator by the thermal oxidation, and
   wherein after the step (g) of forming the protective insulating film, a state where the first film contracts is maintained and a state where the second film expands is maintained.

2. The manufacturing method for semiconductor device according to claim 1,
   wherein in the step (f) of forming the embedding element, the first film is formed in a state of being in contact with an inner-wall surface of the trench including the sidewall surfaces thereof, and the second film is formed in contact with the first film in a state of filling the trench.

3. The manufacturing method for semiconductor device according to claim 2,
wherein in the step (f) of forming the embedding element, a silicon oxide film is formed as the first film by a chemical vapor deposition method and
a polycrystalline silicon film is formed as the second film.

4. The manufacturing method for semiconductor device according to claim 1,
wherein the step (f) of forming the embedding element includes the steps of
(h) forming a first oxidation block film which blocks the thermal oxidation in a state of being in contact with an inner-wall surface of the trench including the sidewall surfaces thereof,
(i) forming the first film in contact with the first oxidation block film, and
(j) forming the second film in contact with the first film.

5. The manufacturing method for semiconductor device according to claim 4,
wherein in the step (f) of forming the embedding element,
a silicon nitride film is formed as the first oxidation block film,
a silicon oxide film is formed as the first film by a chemical vapor deposition method and
a polycrystalline silicon film is formed as the second film.

6. The manufacturing method for semiconductor device according to claim
wherein the step (f) of forming the embedding element includes the steps of
(k) forming a first oxidation block film which blocks the thermal oxidation in a state of being in contact with an inner-wall surface of the trench including the sidewall surfaces thereof,
(l) forming the second film in contact with the first oxidation block film, and
(m) forming the first film in contact with the second film.

7. The manufacturing method for semiconductor device according to claim 6,
wherein in the step (f) of forming the embedding element,
a silicon nitride film is formed as the first oxidation block film,
a silicon oxide film is formed as the first film by a chemical vapor deposition method, and
a polycrystalline silicon film is formed as the second film.

8. The manufacturing method for semiconductor device according to claim 1,
wherein the step (a) of forming the semiconductor element includes the steps of
(n) forming a gate trench which reaches a third depth which is shallower than the first depth from the first principal surface of the semiconductor substrate in the first conductivity type first region of the element region,
(o) forming a gate electrode in the gate trench with a gate insulating film being interposed,
(p) implanting a second conductivity type impurity into the first conductivity type first region of the element region after formation of the protective insulating film and thereby forming a base region down to a fourth depth which is shallower than the third depth from the first principal surface of the semiconductor substrate, and
(q) implanting a first conductivity type impurity into the base region and thereby forming a source region.

9. The manufacturing method for semiconductor device according to claim 8,
wherein the step (a) of forming the semiconductor element further includes the step of
(r) forming a second oxidation block film which blocks the thermal oxidation to cover the gate electrode after formation of the gate electrode and before formation of the protective insulating film.

10. The manufacturing method for semiconductor device according to claim 9,
wherein the step (a) of forming the semiconductor element further includes the step of
(s) removing the second oxidation block film after formation of the protective insulating film.

11. The manufacturing method for semiconductor device according to claim 1,
wherein a plurality of the trenches are arranged in dots in a state of mutually maintaining a first pitch, and
wherein the embedded insulator is formed in each of the tranches which are arranged in dots.

12. The manufacturing method for semiconductor device according to claim 1,
wherein a plurality of the trenches are arranged in stripes in a state of mutually maintaining a second pitch, and
wherein the embedded insulator is formed in each of the trenches which are arranged in stripes.

13. The manufacturing method for semiconductor device according to claim 1,
wherein in the step (c) of forming the trench, in a case where a ratio of the first depth of the trench to a width of the trench is expressed as an aspect ratio,
the aspect ratio is at least about 7.

14. The manufacturing method for semiconductor device according to claim 1,
wherein in the step (c) of forming the trench, in a case where a rate of the area of a region where the trenches are formed in the element region is expressed as an occupancy,
the occupancy is at least about 10%.

* * * * *